United States Patent
Hwang et al.

(10) Patent No.: US 9,923,077 B2
(45) Date of Patent: Mar. 20, 2018

(54) METHODS OF CURING A DIELECTRIC LAYER FOR MANUFACTURE OF A SEMICONDUCTOR DEVICE

(71) Applicants: Yoon-tae Hwang, Seoul (KR);
Ki-joong Yoon, Goyang-si (KR);
Moon-kyu Park, Hwaseong-si (KR);
Sang-jin Hyun, Suwon-si (KR);
Hoon-joo Na, Hwaseong-si (KR)

(72) Inventors: Yoon-tae Hwang, Seoul (KR);
Ki-joong Yoon, Goyang-si (KR);
Moon-kyu Park, Hwaseong-si (KR);
Sang-jin Hyun, Suwon-si (KR);
Hoon-joo Na, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/093,896

(22) Filed: Apr. 8, 2016

(65) Prior Publication Data
US 2016/0307762 A1    Oct. 20, 2016

(30) Foreign Application Priority Data

Apr. 17, 2015 (KR) .......................... 10-2015-0054493

(51) Int. Cl.
*H01L 21/28* (2006.01)
*H01L 21/02* (2006.01)
(Continued)

(52) U.S. Cl.
CPC ...... *H01L 29/513* (2013.01); *H01L 21/28176* (2013.01); *H01L 29/495* (2013.01); *H01L 29/4966* (2013.01); *H01L 29/78* (2013.01)

(58) Field of Classification Search
CPC .......................... H01L 23/552; C23C 16/4404
See application file for complete search history.

(56) References Cited

U.S. PATENT DOCUMENTS 7,153,773 B2    12/2006  Otsuki et al.
7,586,159 B2    9/2009   Lee et al.
(Continued)

FOREIGN PATENT DOCUMENTS

JP    5305989 B2     9/2010
JP    2012-186259    9/2012
(Continued)

*Primary Examiner* — Moazzam Hossain
(74) *Attorney, Agent, or Firm* — Myers Bigel, P.A.

(57) ABSTRACT

A method of curing a dielectric layer, such as a dielectric layer that has a relatively small thickness and/or a narrow width or a complicated shape, is provided. The method of curing a dielectric layer for the manufacture of a semiconductor device includes providing the dielectric layer, wherein the dielectric layer is on a semiconductor layer; forming a first metal-containing layer on the dielectric layer; forming a curing atom screening region in an upper portion of the first metal-containing layer by injecting screening atoms onto an upper surface of the first metal-containing layer; injecting curing atoms into the first metal-containing layer through the upper surface of the first metal-containing layer; and flowing the curing atoms into the dielectric layer in an atmosphere at a first temperature.

20 Claims, 18 Drawing Sheets

(51) Int. Cl.
  *H01L 29/40* (2006.01)
  *H01L 29/423* (2006.01)
  *H01L 29/51* (2006.01)
  *H01L 29/49* (2006.01)
  *H01L 29/78* (2006.01)

(56) References Cited

U.S. PATENT DOCUMENTS

| | | | |
|---|---|---|---|
| 7,785,958 B2 | 8/2010 | Doczy et al. | |
| 7,952,118 B2 | 5/2011 | Jung et al. | |
| 8,138,041 B2 | 3/2012 | Chudzik et al. | |
| 8,575,038 B2 | 11/2013 | Umezawa et al. | |
| 8,679,962 B2 | 3/2014 | Hou et al. | |
| 8,748,251 B2 | 6/2014 | Na et al. | |
| 8,759,925 B2 | 6/2014 | Umezawa et al. | |
| 8,841,182 B1 | 9/2014 | Chen et al. | |
| 8,851,182 B2 | 9/2014 | Chen et al. | |
| 8,993,459 B2 | 3/2015 | Grass et al. | |
| 2004/0102015 A1* | 5/2004 | Choi | H01L 28/40 438/396 |
| 2007/0023842 A1 | 2/2007 | Jung et al. | |
| 2008/0067606 A1 | 3/2008 | Jung et al. | |
| 2009/0001585 A1 | 1/2009 | Joo | |
| 2009/0098706 A1* | 4/2009 | Kim | H01L 21/3105 438/438 |
| 2009/0325369 A1 | 12/2009 | Kim et al. | |
| 2010/0320547 A1* | 12/2010 | Ando | H01L 21/28088 257/411 |
| 2011/0183493 A1* | 7/2011 | Daval | H01L 21/2007 438/458 |
| 2011/0193181 A1 | 8/2011 | Jung et al. | |
| 2011/0298053 A1* | 12/2011 | Zhong | H01L 21/28176 257/368 |
| 2014/0004679 A1 | 1/2014 | Kim et al. | |
| 2015/0017319 A1* | 1/2015 | Jung | C23C 16/4404 427/8 |
| 2016/0307794 A1* | 10/2016 | Deline | H01L 21/76828 |
| 2016/0314963 A1* | 10/2016 | Choi | H01L 21/324 |

FOREIGN PATENT DOCUMENTS

| | | |
|---|---|---|
| KR | 10-0843223 B1 | 6/2008 |
| KR | 10-2010-0003164 | 1/2010 |
| KR | 10-2014-0003154 | 1/2014 |
| KR | 10-2014-0029304 | 3/2014 |
| WO | WO 2011/068096 A1 | 6/2011 |

* cited by examiner

METHODS OF CURING A DIELECTRIC LAYER FOR MANUFACTURE OF A SEMICONDUCTOR DEVICE

CROSS-REFERENCE TO RELATED APPLICATION

This application claims the benefit of Korean Patent Application No. 10-2015-0054493, filed on Apr. 17, 2015, in the Korean Intellectual Property Office, the disclosure of which is incorporated herein in its entirety by reference.

FIELD

The present inventive concepts relate to a method of curing a dielectric layer for the manufacture of a semiconductor device, and more particularly, to a method of curing a dielectric layer that has a relatively small thickness and/or a narrow width or has a complicated shape.

BACKGROUND

Small-sized and various types of transistors have been proposed to manufacture a semiconductor device having high integration density and high reliability. In addition, a dielectric layer including various materials has been proposed to achieve characteristics that are required by the semiconductor device having high integration density and high reliability.

However, since a dielectric layer, which is included in small-sized and various types of transistors, may also have a relatively small thickness and/or a narrow width or have a complicated shape, there is a difficulty in obtaining required dielectric characteristics.

SUMMARY

The present inventive concepts provide a method of curing a dielectric layer for the manufacture of a semiconductor device, which has a relatively small thickness and/or a narrow width or has a complicated shape.

According to an aspect of the present inventive concepts, there is provided a method of curing a dielectric layer for the manufacture of a semiconductor device, the method including: providing the dielectric layer, wherein the dielectric layer is on a semiconductor layer; forming a first metal-containing layer on the dielectric layer; forming a curing atom screening region in an upper portion of the first metal-containing layer by injecting screening atoms onto an upper surface of the first metal-containing layer; injecting curing atoms into the first metal-containing layer through the upper surface of the first metal-containing layer; and flowing the curing atoms into the dielectric layer in an atmosphere at a first temperature.

The method may further include moving defect-inducing atoms existing in the dielectric layer and/or on a surface of the dielectric layer to the first metal-containing layer in an atmosphere at a second temperature, wherein the second temperature is greater than the first temperature.

The method may further include, after the flowing the curing atoms into the dielectric layer, removing the first metal-containing layer; and forming a second metal-containing layer on the dielectric layer.

The dielectric layer may include a gate dielectric film, and the second metal-containing layer may be a gate electrode.

The gate dielectric film and the gate electrode may form at least one selected from a planar field effect transistor (FET), a fin-type FET (FinFET), a gate-all-around (GAA) FET, a vertical columnar FET, and a nanowire FET.

The method may further include, after flowing the curing atoms into the dielectric layer, forming a second metal-containing layer on the first metal-containing layer.

The dielectric layer may include a first dielectric layer having a first relative dielectric constant and a second dielectric layer on the first dielectric layer, the second dielectric layer having a second relative dielectric constant that is higher than the first relative dielectric constant, and wherein flowing the curing atoms into the dielectric layer may include flowing the curing atoms into the second dielectric layer.

The first dielectric layer may include one selected from silicon oxide, silicon nitride, silicon oxynitride, gallium oxide, germanium oxide, and a combination thereof.

The second dielectric layer may include one selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a combination thereof.

The first metal-containing layer may be formed in an atmosphere at a third temperature, wherein forming the curing atom screening region may include supplying screening atom precursors onto the first metal-containing layer in-situ after forming the first metal-containing layer, wherein the screening atom precursors may be thermally decomposed at a temperature that is lower than the third temperature.

The screening atom precursors may be in a gas phase or a liquid phase.

The screening atom precursors may be silicon chloride, boron chloride, nitrogen fluoride, sulfur fluoride, carbon fluoride, hydrogen bromide, sulfide of cobalt, fluorocarbon, hydrofluorocarbon, methane, ammonia, or titanium tetrachloride.

The amount of curing atoms that are injected into the first metal-containing layer may be controlled by the amount of screening atoms that are injected into the first metal-containing layer.

Injecting the curing atoms into the first metal-containing layer may be performed in an air atmosphere, an oxygen atmosphere, a water vapor atmosphere, a nitrogen atmosphere, or an oxygen and nitrogen atmosphere.

The first metal-containing layer may include one selected from TiN, TaN, W, TiAlC, TaAlC, TaAl, TiAl, HfAl, Al, Ti, WN, Ru, Mo, and a combination thereof.

The screening atoms may be Si, B, N, S, C, Br, Co, or Ti atoms.

The curing atoms may be oxygen or nitrogen atoms.

The curing atoms may be oxygen atoms and, responsive to injecting the curing atoms into the first metal-containing layer, at least a portion of the first metal-containing layer may not be oxidized.

Responsive to forming the curing atom screening region, a thickness of the first metal-containing layer may increase by 5 Å or less.

Responsive to injecting the curing atoms into the first metal-containing layer, the curing atoms may not be injected into the first metal-containing layer after the lapse of a threshold time.

According to another aspect of the present inventive concepts, there is provided a method of curing a dielectric layer for the manufacture of a semiconductor device, the method including: forming a high-permittivity dielectric layer on a semiconductor layer; forming a sacrificial metal-containing layer on the high-permittivity dielectric layer at a first temperature; supplying screening atom precursors onto the sacrificial metal-containing layer in-situ to form a curing atom screening region in an upper portion of the sacrificial metal-containing layer, wherein the screening atom precursors thermally decompose to generate screening atoms at a second temperature that is lower than the first temperature; injecting curing atoms into the upper portion of the sacrificial metal-containing layer through an upper surface of the sacrificial metal-containing layer; flowing the curing atoms into the high-permittivity dielectric layer by performing a heat treatment in an atmosphere at a third temperature; and scavenging defect-inducing atoms existing on a surface of the high-permittivity dielectric layer by performing a heat treatment in an atmosphere at a fourth temperature that is higher than the third temperature.

The curing atoms may be oxygen atoms and, responsive to injecting the curing atoms into the upper portion of the sacrificial metal-containing layer, at least a portion of the sacrificial metal-containing layer may not be oxidized due to the curing atom screening region.

The screening atom precursors may be silicon precursors in a gas phase.

Responsive to forming the curing atom screening region, a thickness of the sacrificial metal-containing layer may increase by 5 Å or less, wherein the amount of curing atoms that are injected into the upper portion of the sacrificial metal-containing layer may be inversely proportional to the increase in the thickness of the sacrificial metal-containing layer.

The sacrificial metal-containing layer may include metal, metal nitride, or metal carbide, and wherein the method may further include removing the sacrificial metal-containing layer; and forming a gate electrode.

According to a further aspect of the present inventive concepts, there is a provided a method of curing a dielectric layer for the manufacture of a semiconductor device, the method including: contacting screening atom precursors to a first metal-containing layer, wherein the first metal-containing layer is on a dielectric layer; forming a curing atom screening region in an upper portion of the first metal-containing layer in an atmosphere at a first temperature; injecting curing atoms into the first metal-containing layer; and flowing the curing atoms into the dielectric layer.

The method may further include generating screening atoms by thermally decomposing the screening atom precursors, and wherein forming the curing atom screening region in the upper portion of the first metal-containing layer may include injecting the screening atoms into the upper portion of the first metal-containing layer.

Response to forming the curing atom screening region in the upper portion of the first metal-containing layer, a thickness of the first metal-containing layer may increase by 5 Å or less.

Injecting the curing atoms into the first metal-containing layer may include contacting a gas comprising the curing atoms onto the first metal-containing layer, and flowing the curing atoms into the dielectric layer may include performing a first heat treatment in an atmosphere at a second temperature, wherein the second temperature is higher than the first temperature.

The method may further include moving defect-inducing atoms present in the dielectric layer and/or on a surface of the dielectric layer to the first metal-containing layer by performing a second heat treatment in an atmosphere at a third temperature, wherein the third temperature is higher than the second temperature.

BRIEF DESCRIPTION OF THE DRAWINGS

The above and other aspects, features and advantages of the present inventive concepts will become more apparent in view of the attached drawings and accompanying detailed description. The drawings provided herein represent non-limiting, example embodiments according to various embodiments of the present inventive concepts.

DETAILED DESCRIPTION OF THE EMBODIMENTS

Figure 1:
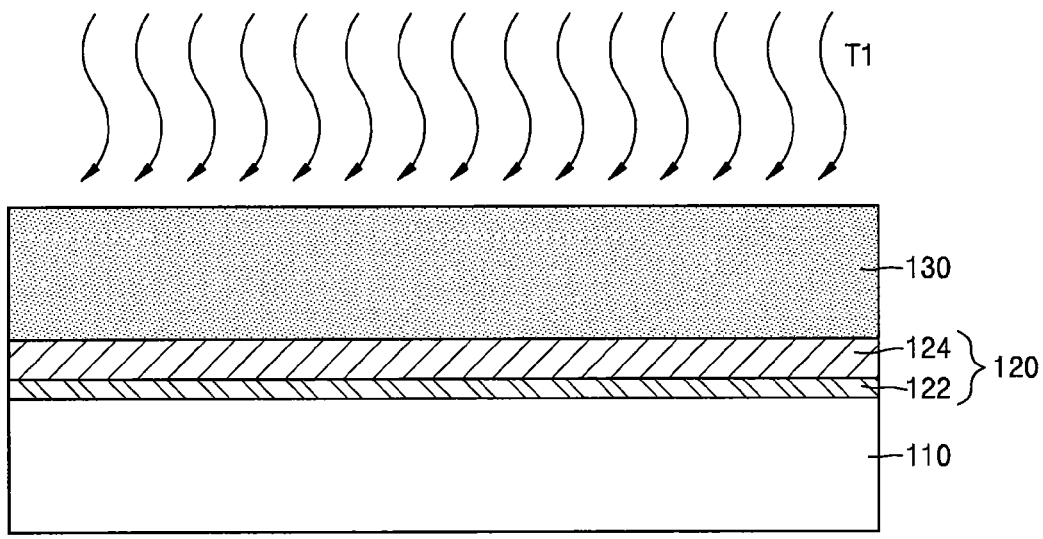
FIG. 1 is a cross-sectional view illustrating a process of forming a dielectric layer and a first metal-containing layer, according to an example embodiment of the present inventive concepts.

Various example embodiments are described below with reference to the accompanying drawings, in which some example embodiments are shown. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the disclosure.

The terminology used herein is for the purpose of describing particular example embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," and the like, may be used herein for ease of disclosure to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. For example, an implanted region illustrated as a rectangle may actually have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which these present inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIGS. 1 through 8 are cross-sectional views sequentially illustrating a method of curing a dielectric layer for the manufacture of a semiconductor device, according to an example embodiment of the present inventive concepts.

FIG. 1 is a cross-sectional view illustrating a process of forming a dielectric layer and a first metal-containing layer, according to an example embodiment of the present inventive concepts.

Referring to FIG. 1, a dielectric layer 120 and a first metal-containing layer 130 are sequentially formed on a semiconductor layer 110.

The semiconductor layer 110 may include a semiconductor material. The semiconductor layer 110 may include, for example, silicon (Si). Alternatively, the semiconductor layer 110 may include a semiconductor element, such as, for example, germanium (Ge), or a compound semiconductor material, such as, for example, silicon carbide (SiC), gallium arsenide (GaAs), indium arsenide (InAs), or indium phosphide (InP).

The semiconductor layer 110 may be a substrate including a semiconductor material or a semiconductor material layer formed on a base substrate (not shown). For example, the semiconductor layer 110 may form a channel region of a transistor included in a semiconductor device.

In another embodiment, the semiconductor layer 110 may have a silicon on insulator (SOI) structure. For example, the semiconductor layer 110 may include a buried oxide (BOX) layer. The semiconductor layer 110 may include a conductive region, for example, a well doped with impurities. The semiconductor layer 110 may have various device isolation structures, such as a shallow trench isolation (STI) structure and a deep trench isolation (DTI) structure.

Although the semiconductor layer 110 shown in FIG. 1 has a flat shape, this is only an illustration of a microscopic portion and the shape of the semiconductor layer 110 is not limited thereto. For example, the semiconductor layer 110 may have various shapes that may form a channel region of a transistor included in a semiconductor device. FIGS. 18 through 22 illustrate some embodiments in which the semiconductor layer 110 forms a channel region of a transistor.

The dielectric layer 120 is formed on the semiconductor layer 110. The dielectric layer 120 may include silicon oxide, silicon nitride, silicon oxynitride, gallium oxide, germanium oxide, high-permittivity dielectric material, or a combination thereof. For example, the dielectric layer 120 may have a dielectric constant of about 10 to about 25. The dielectric layer 120 may be formed by using an atomic layer deposition (ALD) process, a chemical vapor deposition (CVD) process, or a physical vapor deposition (PVD) process.

The dielectric layer 120 may include a first dielectric layer 122 having a first relative dielectric constant, and a second dielectric layer 124 formed on the first dielectric layer 122 and having a second relative dielectric constant that is higher than the first relative dielectric constant.

The first dielectric layer 122 may include silicon oxide, silicon nitride, silicon oxynitride, gallium oxide, or germanium oxide, but is not limited thereto. The first dielectric layer 122 may be an oxide, nitride, or oxynitride of a material forming and/or included in the semiconductor layer 110.

The second dielectric layer 124 may include a high-permittivity dielectric having a relative dielectric constant that is higher than those of silicon oxide and silicon nitride. The second dielectric layer 124 may include one selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a combination thereof, but is not limited thereto.

Although the dielectric layer 120 shown in FIG. 1 has a flat shape, this is only an illustration of an enlargement of a microscopic portion and the shape of the dielectric layer 120 is not limited thereto. For example, the dielectric layer 120 may have various shapes that may form a gate insulating layer of a transistor included in a semiconductor device. For example, the first and second dielectric layers 122 and 124 or the second dielectric layer 124 may have a structure protruding from an upper surface of the semiconductor layer 110. FIGS. 18 through 22 illustrate some embodiments in which the dielectric layer 120 forms gate insulating layers 120-1 to 120-5 of a transistor.

The first metal-containing layer 130 is formed on the dielectric layer 120. The first metal-containing layer 130 may include one selected from TiN, TaN, W, TiAlC, TaAlC, TaAl, TiAl, HfAl, Al, Ti, WN, Ru, Mo, and a combination thereof.

Although the first metal-containing layer 130 shown in FIG. 1 has a flat shape, this is only an illustration of a microscopic portion and the shape of the first metal-containing layer 130 is not limited thereto. For example, when the first and second dielectric layers 122 and 124 or the second dielectric layer 124 have a structure protruding from an upper surface of the semiconductor layer 110, the first metal-containing layer 130 may have a shape in which the first metal-containing layer 130 fills the whole or a portion of a space that is limited and/or defined by the protruding structure.

The first metal-containing layer 130 may be formed in an atmosphere at a first temperature T1 that is relatively higher than room temperature. For example, the first temperature T1 may be from about 400° C. to about 500° C. Accordingly, immediately after the first metal-containing layer 130 is formed, the first metal-containing layer 130 may have the first temperature T1 or a temperature similar to the first temperature T1. Thus, T1 corresponds to the temperature used to form the first metal-containing layer 130 and, after formation, the first metal-containing layer may have a temperature equivalent to T1 or similar thereto.

Figure 2:
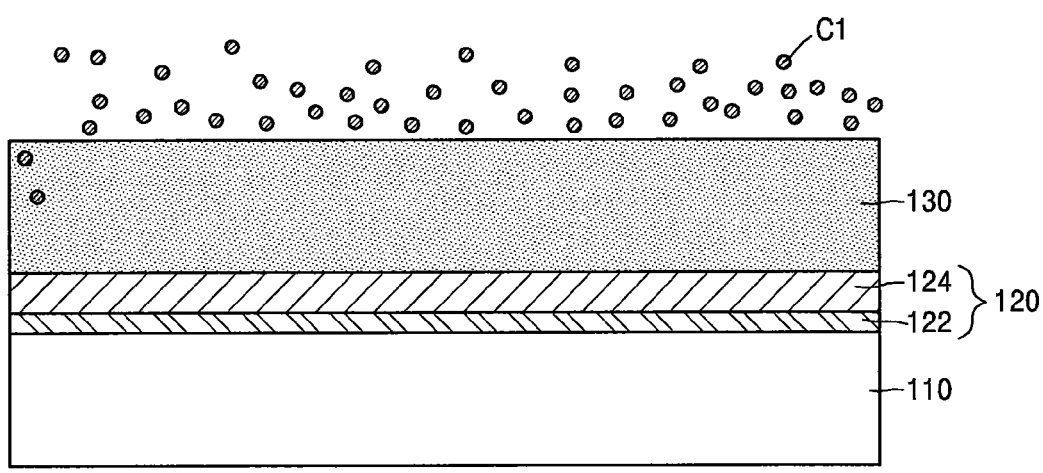
FIG. 2 is a cross-sectional view illustrating a process of supplying screening atom precursors to a first metal-containing layer, according to an example embodiment of the present inventive concepts.

FIG. 2 is a cross-sectional view illustrating a process of supplying screening atom precursors to a first metal-containing layer, according to an example embodiment of the present inventive concepts.

Referring to FIG. 2, after the first metal-containing layer 130 is formed, screening atom precursors C1 are supplied onto the first metal-containing layer 130 in-situ. Supplying the screening atom precursors C1 onto the first metal-containing layer 130 in-situ may be done by injecting the screening atom precursors C1 into a chamber, in which the first metal-containing layer 130 has been formed, in a state in which the first metal-containing layer 130 maintains the first temperature T1 or a temperature similar to the first temperature T1.

The screening atom precursors C1 may be thermally decomposed at the first temperature T1 and/or at a temperature that is lower than the first temperature T1. The screening atom precursors C1 may be in a gas phase or a liquid phase. The screening atom precursors C1 may be, for example, silicon chloride, boron chloride, nitrogen fluoride, sulfur fluoride, carbon fluoride, hydrogen bromide, sulfide of cobalt, fluorocarbon, hydrofluorocarbon, methane, ammonia, and/or titanium tetrachloride, but are not limited thereto.

Figure 3:
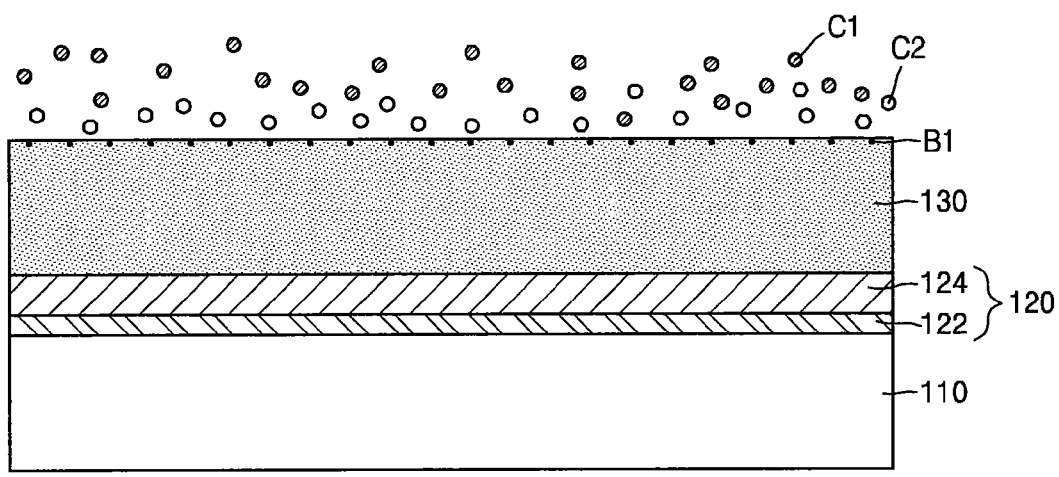
FIG. 3 is a cross-sectional view illustrating a process of injecting screening atoms onto an upper surface of a first metal-containing layer, according to an example embodiment of the present inventive concepts.

FIG. 3 is a cross-sectional view illustrating a process of injecting screening atoms onto and/or into an upper surface of a first metal-containing layer 130 according to an example embodiment of the present inventive concepts.

Referring to FIG. 3, the screening atom precursors C1 may be thermally decomposed on the first metal-containing layer 130 maintaining the first temperature T1 or a temperature similar to the first temperature T1, and, thus, screening atoms B1 may be generated. The generated screening atoms B1 may be injected onto and/or into the upper surface of the first metal-containing layer 130. When the screening atoms B1 are injected onto and/or into the upper surface of the first metal-containing layer 130 as a result of the decomposition of the screening atom precursors C1, first by-products C2 may be generated. The screening atoms B1 may be, for example, Si, B, N, S, C, Br, Co, or Ti atoms.

Figure 4:
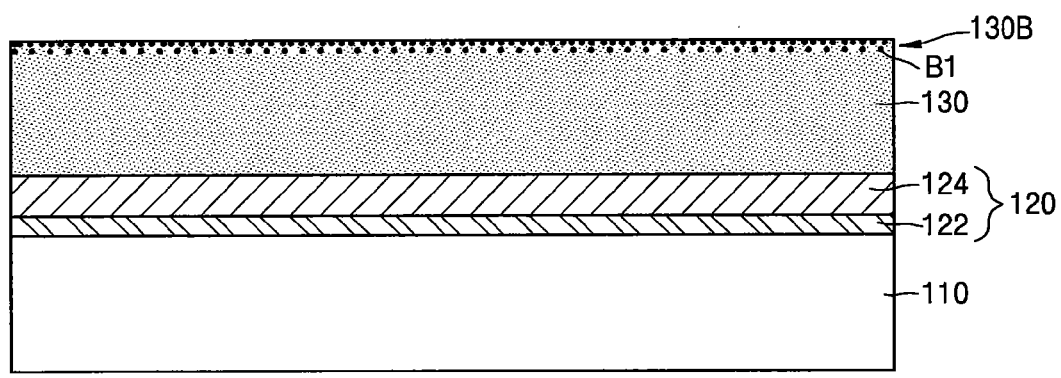
FIG. 4 is a cross-sectional view illustrating a process of forming a curing atom screening region, according to an example embodiment of the present inventive concepts.

FIG. 4 is a cross-sectional view illustrating a process of forming a curing atom screening region, according to an example embodiment of the present inventive concepts.

Referring to FIG. 4, a curing atom screening region 130B is formed in an upper portion of the first metal-containing layer 130 by injecting the screening atoms B1 onto and/or into the upper surface of the first metal-containing layer 130. The formation of the curing atom screening region 130B means that the screening atoms B1 are deposited on the upper surface of the first metal-containing layer 130 and/or the screening atoms B1 are injected into an upper portion of the first metal-containing layer 130 through a reaction between the screening atoms B1 and the first metal-containing layer 130.

As the curing atom screening region 130B is formed in an upper portion of the first metal-containing layer 130, the thickness of the first metal-containing layer 130 may increase by 5 Å or less. When the thickness of the first metal-containing layer 130 increases by more than 5 Å by injecting the screening atoms B1 into the upper portion of the first metal-containing layer 130, a separate layer including the screening atoms B1 may be formed on the upper surface of the first metal-containing layer 130. In this case, the separate layer may function as a barrier that blocks curing atoms D2 (refer to FIG. 6) from being injected into the first metal-containing layer 130. However, when the thickness of the first metal-containing layer 130 increases by 5 Å or less as a result of the formation of the curing atom screening region 130B according to the present inventive concepts, the screening atoms B1 forming the curing atom screening region 130B do not form a separate layer and may perform a function of adjusting the amount of curing atoms D2 that are injected into the first metal-containing layer 130.

Figure 5:
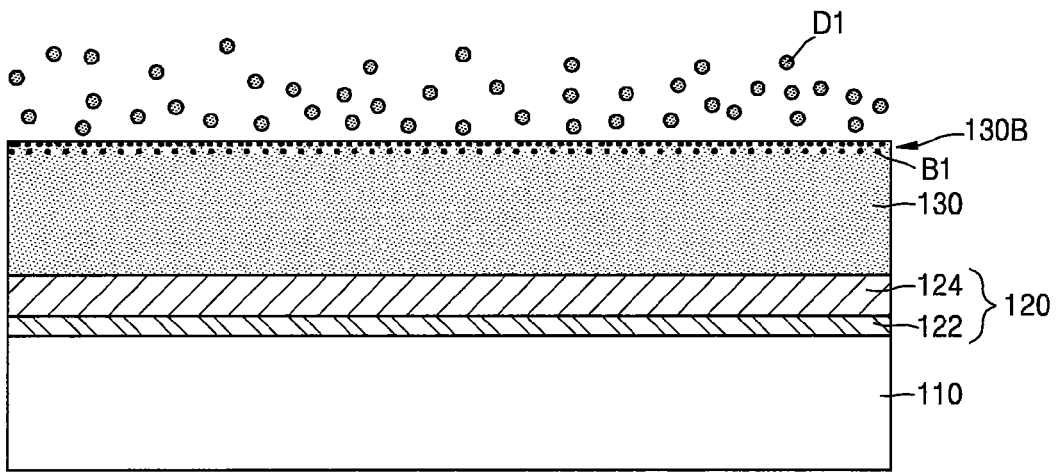
FIG. 5 is a cross-sectional view illustrating a process of forming an atmosphere for the injection of curing atoms into a first metal-containing layer, according to an example embodiment of the present inventive concepts.

FIG. 5 is a cross-sectional view illustrating a process of forming an atmosphere for the injection of curing atoms into the first metal-containing layer 130, according to an example embodiment of the present inventive concepts.

Referring to FIG. 5, a curing atmosphere gas D1 including the curing atoms D2 (refer to FIG. 6) is supplied onto the first metal-containing layer 130 to inject the curing atoms D2 into the first metal-containing layer 130. The curing atmosphere gas D1 may be air, oxygen, water vapor, nitrogen, or oxygen and nitrogen. In other words, an air atmosphere, an oxygen atmosphere, a water vapor atmosphere, a nitrogen atmosphere, or an oxygen and nitrogen atmosphere may be used to inject the curing atoms D2 into the first metal-containing layer 130.

Figure 6:
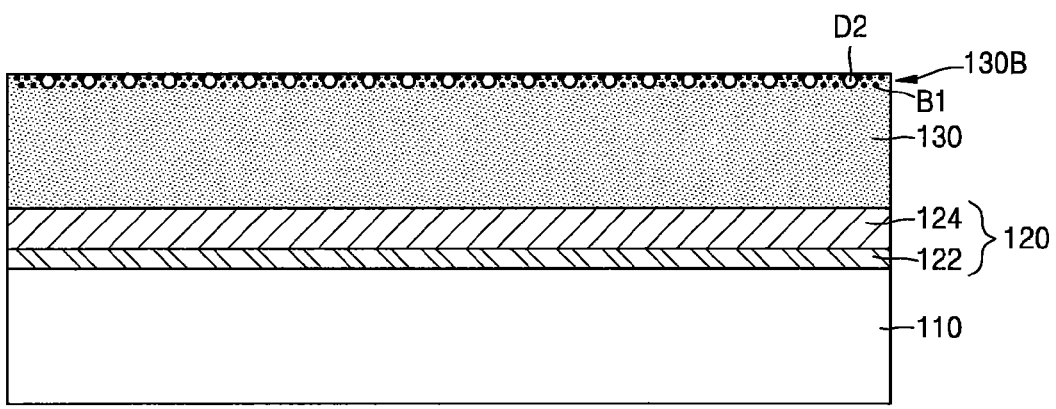
FIG. 6 is a cross-sectional view illustrating a process of injecting curing atoms into a first metal-containing layer, according to an example embodiment of the present inventive concepts.

FIG. 6 is a cross-sectional view illustrating a process of injecting curing atoms into the first metal-containing layer 130, according to an example embodiment of the present inventive concepts.

Referring to FIG. 6, the curing atoms D2, which are included in the curing atmosphere gas D1 shown in FIG. 5, are injected into the first metal-containing layer 130. A relatively small amount of curing atoms D2 may be injected into the first metal-containing layer 130 due to the screening atoms B1 included in the curing atom screening region 130B. The curing atoms D2 may be, for example, oxygen atoms or nitrogen atoms.

The amount of curing atoms D2 that are injected into the first metal-containing layer 130 is inversely proportional to the amount of screening atoms B1 included in the first metal-containing layer 130, and particularly, in the curing atom screening region 130B. In other words, when the curing atom screening region 130B includes a relatively large amount of screening atoms B1, a relatively small amount of curing atoms D2 may be injected into the first metal-containing layer 130, compared to when the curing atom screening region 130B includes a relatively small amount of screening atoms B1.

When the amount of screening atoms B1 included in the curing atom screening region 130B is constant, the amount of curing atoms D2 that are injected into the first metal-containing layer 130 may increase depending on a time for which the curing atoms D2 are injected into the first metal-containing layer 130. However, when the time for which the curing atoms D2 are injected into the first metal-containing layer 130 is equal to or greater than a threshold time, the amount of curing atoms D2 that are injected into the first metal-containing layer 130 may not increase. This is because when the curing atom screening region 130B is formed in the first metal-containing layer 130, the curing atoms D2 are injected only into an upper portion of the first metal-containing layer 130 having the curing atom screening region 130B formed therein.

When the curing atoms D2 are nitrogen atoms or oxygen atoms, a portion of the first metal-containing layer 130 may be nitrified or oxidized after the curing atoms D2 are injected into the first metal-containing layer 130. However, since the amount of curing atoms D2 that are injected into the first metal-containing layer 130 may be adjusted by the screening atoms B1 included in the curing atom screening region 130B, at least a portion of the first metal-containing layer 130 may not be nitrified or oxidized.

If the curing atom screening region 130B includes a relatively large amount of screening atoms B1 and, thus, a separate layer including the screening atoms B1 is formed on the first metal-containing layer 130, the curing atoms D2 may not be injected into the first metal-containing layer 130. In this case, the whole first metal-containing layer 130 may not be nitrified or oxidized.

On the contrary, if the curing atom screening region 130B is not formed in the first metal-containing layer 130, the curing atoms D2 may be unlimitedly injected into the first metal-containing layer 130 until the first metal-containing layer 130 is saturated with the curing atoms D2, and, thus, the amount of curing atoms D2 that are injected into the first metal-containing layer 130 may not be adjusted. In this case, the whole first metal-containing layer 130 may be nitrified or oxidized.

In order to inject the screening atoms B1 into the first metal-containing layer 130 to form the curing atom screening region 130B, a soak process may be performed. However, the present inventive concepts are not limited thereto, and all processes using screening atom precursors C1 in a gas phase or a liquid phase may be used.

Figure 7:
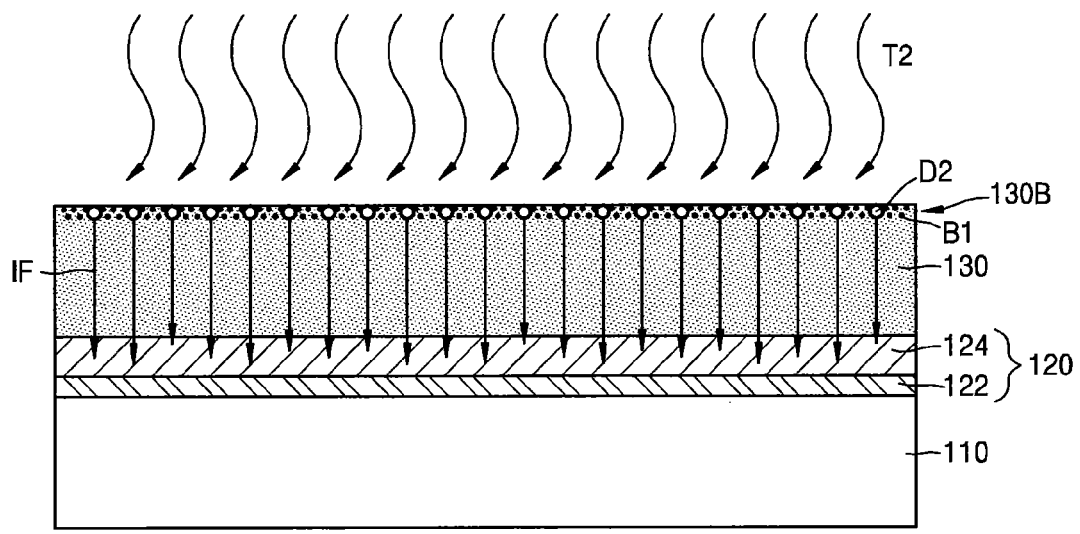
FIG. 7 is a cross-sectional view illustrating a process of making curing atoms flow into a dielectric layer, according to an example embodiment of the present inventive concepts.

FIG. 7 is a cross-sectional view illustrating a process of making curing atoms flow into a dielectric layer 120, according to an example embodiment of the present inventive concepts.

Referring to FIG. 7, a heat treatment is performed in an atmosphere at a second temperature T2 to make the curing atoms D2, which have been injected into the first metal-containing layer 130, flow into the dielectric layer 120 (refer to operation IF). Thus, the heat treatment for making the curing atoms D2 flow from the first metal-containing layer 130 to the dielectric layer 120 may be carried out at the second temperature T2. The second temperature T2 may be a relatively low temperature. For example, the second temperature T2 may be from about 100° C. to about 250° C.

When the heat treatment is performed at the second temperature T2 that is a relatively low temperature, the curing atoms D2 present in an upper portion of the first metal-containing layer 130 may be diffused and thus may flow into the dielectric layer 120. When the dielectric layer 120 includes oxygen atoms and nitrogen atoms, defects, such as oxygen vacancy or nitrogen vacancy, may exist in the dielectric layer 120. The curing atoms D2 flowing into the dielectric layer 120 may remove the defects, such as oxygen vacancy or nitrogen vacancy.

For example, when the second dielectric layer 124 includes a high-permittivity dielectric, defects may exist much more in the second dielectric layer 124 than in the first dielectric layer 122. Accordingly, the curing atoms D2 may flow mainly into the second dielectric layer 124 to remove the defects, such as oxygen vacancy or nitrogen vacancy.

If the curing atom screening region 130B is not formed in the first metal-containing layer 130, then curing atoms D2 may be unlimitedly injected into the first metal-containing layer 130, and thus, surplus curing atoms may exist even after defects (e.g., oxygen vacancy or nitrogen vacancy) existing in the second dielectric layer 124 are removed. The surplus curing atoms may make the first dielectric layer 122, which has a relatively low relative dielectric constant, grow in thickness, and thus, the relative dielectric constant of the entire dielectric layer 120 may be lower and/or reduced.

However, when the curing atom screening region 130B is formed in the first metal-containing layer 130, the amount of curing atoms D2 may be adjusted so that only curing atoms D2 required to remove defects (e.g., oxygen vacancy or nitrogen vacancy) existing in the second dielectric layer 124 are injected into the first metal-containing layer 130, and thus, a problem in which the relative dielectric constant of the entire dielectric layer 120 is reduced may not occur. Accordingly, the reliability and/or characteristics of a semiconductor device using the dielectric layer 120 as gate insulating layers of transistors may be improved. In some embodiments, the curing atom screening region 130B in the first metal-containing layer 130 provides, determines, and/or limits the amount of curing atoms D2 that may be injected into the first metal-containing layer 130. The amount of curing atoms D2 that may be injected into the first metal-containing layer 130 may be an amount sufficient to remove defects (e.g., oxygen vacancy or nitrogen vacancy) existing in the second dielectric layer 124, and, thus, a problem in which the relative dielectric constant of the entire dielectric layer 120 is reduced may not occur. In some embodiments, the curing atom screening region 130B provides and/or allows only an amount of curing atoms D2 sufficient and/or necessary to remove defects (e.g., oxygen vacancy or nitrogen vacancy) existing in the second dielectric layer 124 to be injected into the first metal-containing layer 130.

Figure 8:
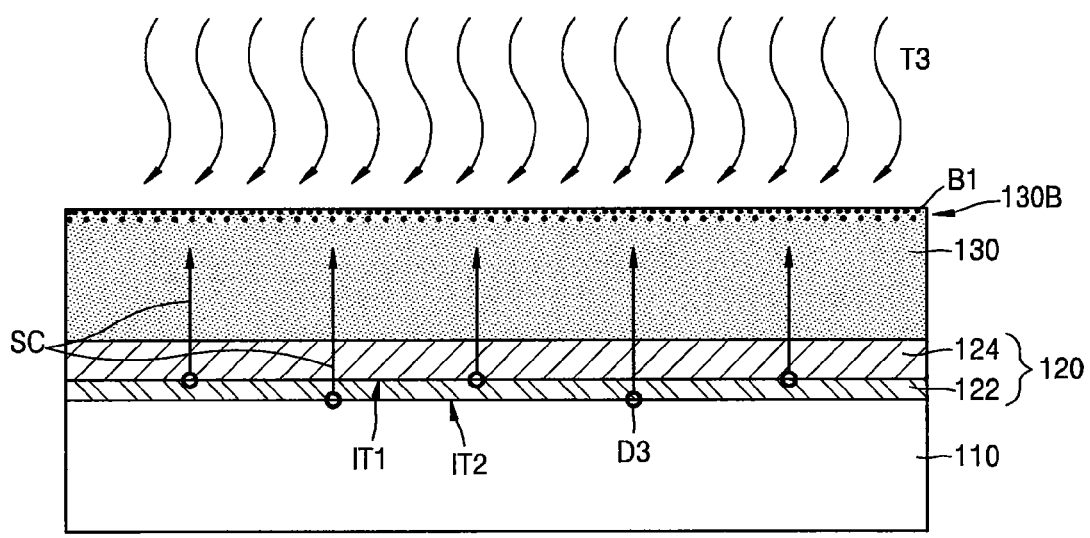
FIG. 8 is a cross-sectional view illustrating a process of scavenging defect-inducing atoms existing in a dielectric layer or on the surface of the dielectric layer, according to an example embodiment of the present inventive concepts.

FIG. 8 is a cross-sectional view illustrating a process of scavenging defect-inducing atoms existing in the dielectric layer 120 or on a surface of the dielectric layer 120, according to an example embodiment of the present inventive concepts.

Referring to FIG. 8, a heat treatment is performed in an atmosphere at a third temperature T3, which is higher than the second temperature T2 described in reference to FIG. 7, to scavenge defect-inducing atoms D3 existing in the dielectric layer 120 and/or on a surface of the dielectric layer 120 and move the scavenged defect-inducing atoms D3 to the first metal-containing layer 130 (refer to operation SC). The third temperature T3 may be relatively higher than the second temperature T2. For example, the third temperature T3 may be from about 300° C. to about 500° C.

When a heat treatment is performed in an atmosphere at the third temperature T3, the defect-inducing atoms D3 existing in the dielectric layer 120 or on a surface of the dielectric layer 120 may be scavenged from the inside of the dielectric layer 120 and/or the surface of the dielectric layer 120, and the scavenged defect-inducing atoms D3 may move to the first metal-containing layer 130. The defect-inducing atoms D3 may be, for example, nitrogen atoms or oxygen atoms.

When the dielectric layer 120 includes the first dielectric layer 122 and the second dielectric layer 124, the defect-inducing atoms D3 may exist in a first interface IT1, which is an interface between the first dielectric layer 122 and the second dielectric layer 124, or a second interface IT2, which is an interface between the first dielectric layer 122 and the semiconductor layer 110. However, when a heat treatment is performed in the atmosphere of the third temperature T3, the defect-inducing atoms D3 existing in the first interface IT1 and/or the second interface IT2 may be scavenged from the first interface IT1 and/or the second interface IT2, and thus, the interface trap density of the first interface IT1 and/or the second interface IT2 may be reduced.

If the curing atom screening region 130B is not formed in the first metal-containing layer 130, the entire first metal-containing layer 130 is nitrified or oxidized, and, thus, the defect-inducing atoms D3 existing in the first interface IT1 and/or the second interface IT2 may not move to the first metal-containing layer 130 even if a heat treatment is performed in the atmosphere of the third temperature T3.

However, when the curing atom screening region 130B is formed in the first metal-containing layer 130, at least a portion of the first metal-containing layer 130 is not nitrified or oxidized, and, thus, the defect-inducing atoms D3 existing in the first interface IT1 and/or the second interface IT2 may move to the first metal-containing layer 130. Accordingly, the reliability and/or characteristics of a semiconductor device using the dielectric layer 120 as gate insulating layers of transistors may be improved.

Both the heat treatment in the atmosphere of the second temperature T2 and the heat treatment in the atmosphere of the third temperature T3 may be performed, and only one of them may be selectively performed.

Figure 9:
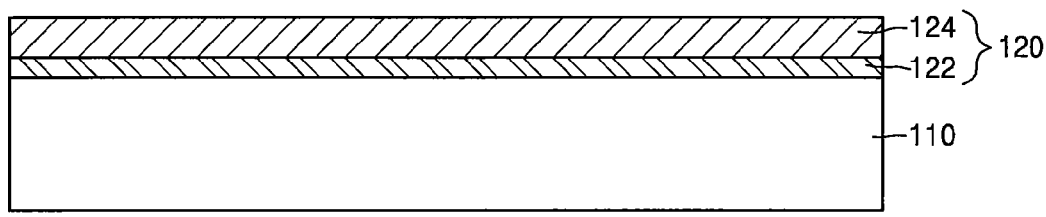
FIGS. 9 and 10 are cross-sectional views illustrating a process of forming a second metal-containing layer, according to an example embodiment of the present inventive concepts.
Figure 10:
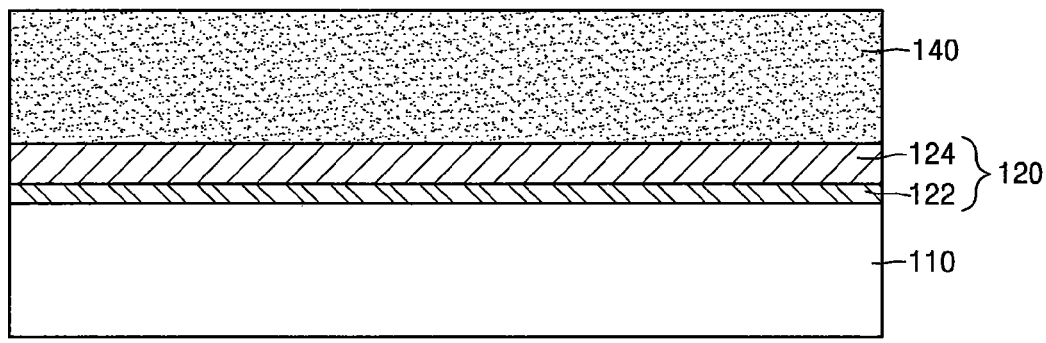

FIGS. 9 and 10 are cross-sectional views illustrating a process of forming a second metal-containing layer, according to an example embodiment of the present inventive concepts.

Referring to FIG. 9, the first metal-containing layer 130 of FIG. 8 is removed after the heat treatments described with reference to FIGS. 7 and 8 are performed. Since the first metal-containing layer 130 is removed after the dielectric layer 120 is cured, the first metal-containing layer 130 may be referred to as a sacrificial metal-containing layer.

When the first metal-containing layer 130 is removed, the curing atoms D2 of FIG. 7, which remain in the first metal-containing layer 130, and/or the defect-inducing atoms D3 of FIG. 8, which have moved to the first metal-containing layer 130, may also be removed together with the first metal-containing layer 130.

Referring to FIG. 10, a second metal-containing layer 140 is formed on the dielectric layer 120 after the first metal-containing layer 130 of FIG. 8 is removed. The dielectric layer 120 and the second metal-containing layer 140 may form, respectively, a gate insulating layer and a gate electrode of a transistor included in a semiconductor device.

The second metal-containing layer 140 may be a single film, but may be a multilayer film including a plurality of films The second metal-containing layer 140 may include, for example, at least one metal selected from Ti, Ta, Al, W, Ru, Nb, Mo, Hf, Ni, Co, Pt, Yb, Tb, Dy, Er, and Pd, or a metal compound, such as a metal nitride including at least one metal, a metal doped with carbon, or a metal nitride doped with carbon.

Figure 11:
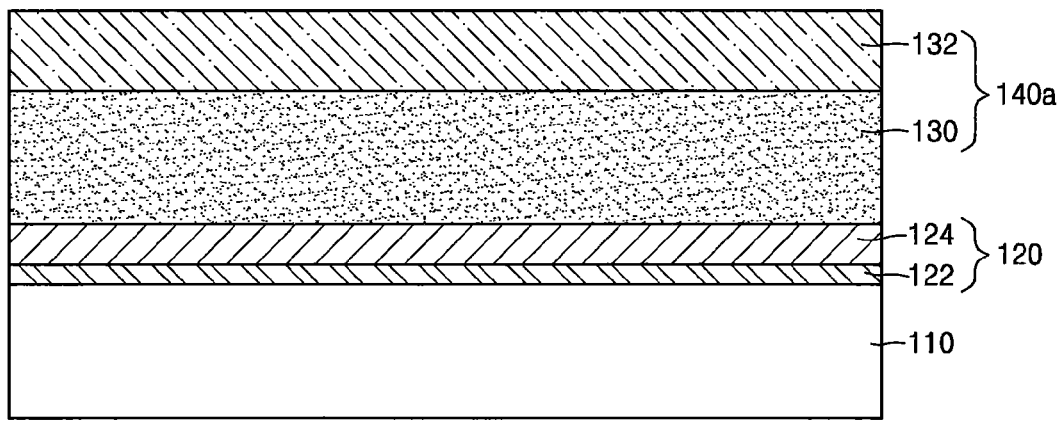
FIG. 11 is a cross-sectional view illustrating a process of forming a third metal-containing layer, according to an example embodiment of the present inventive concepts.

FIG. 11 is a cross-sectional view illustrating a process of forming a third metal-containing layer, according to an example embodiment of the present inventive concepts.

Referring to FIG. 11, a third metal-containing layer 132 may be formed on the first metal-containing layer 130. Before the third metal-containing layer 132 is formed, the entire curing atom screening region 130B (refer to FIG. 8), formed in an upper portion of the first metal-containing layer 130, or a portion of the curing atom screening region 130B may be removed. However, the present inventive concepts are not limited thereto.

The third metal-containing layer 132 may be a single film, but may be a multilayer film including a plurality of films The third metal-containing layer 132 may include, for example, at least one metal selected from Ti, Ta, Al, W, Ru, Nb, Mo, Hf, Ni, Co, Pt, Yb, Tb, Dy, Er, and Pd, or a metal compound, such as a metal nitride including at least one metal, a metal doped with carbon, or a metal nitride doped with carbon.

The first and third metal-containing layers 130 and 132 together may form a gate electrode 140a of a transistor included in a semiconductor device.

Although not illustrated in FIG. 11, a source/drain region SD may include a semiconductor layer epitaxially grown from an active region FN. The source/drain region SD may have an embedded SiGe structure including a plurality of epitaxially grown SiGe layers, an epitaxially grown Si layer, or an epitaxially grown SiC layer.

Figure 12:
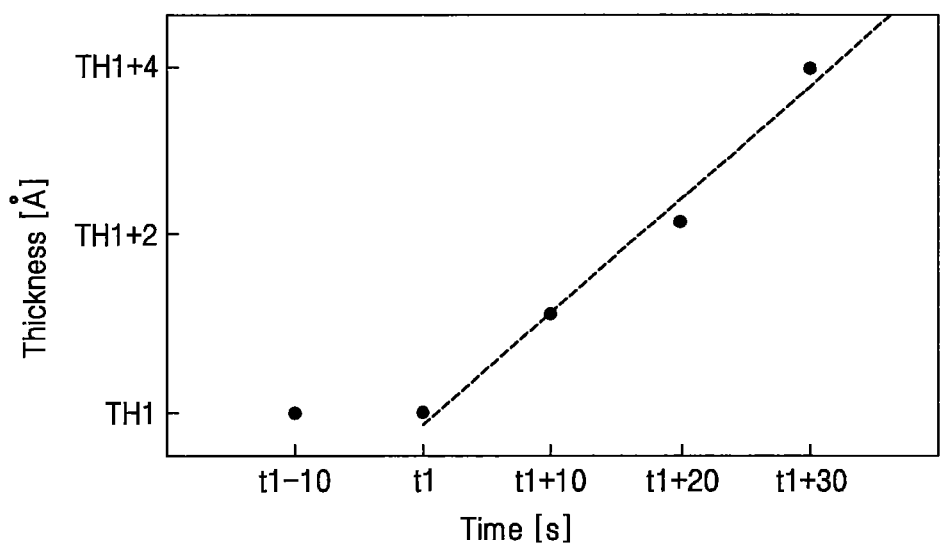
FIG. 12 is a graph illustrating an increase in the thickness of a first metal-containing layer, depending on a screening atom injection time, in a process of injecting screening atoms into an upper surface of the first metal-containing layer, according to an example embodiment of the present inventive concepts.

FIG. 12 is a graph illustrating an increase in the thickness of the first metal-containing layer 130, depending on a screening atom injection time, in a process of injecting screening atoms into an upper surface of the first metal-containing layer 130, according to an example embodiment of the present inventive concepts.

Referring to FIG. 12 together with FIGS. 2 through 4, after the first metal-containing layer 130 having a first thickness TH1 is formed, the screening atom precursors C1 are supplied onto the first metal-containing layer 130 in-situ, and, thus, the screening atoms B1 are injected into and/or onto the upper surface of the first metal-containing layer 130. Until an injection time of the screening atoms B1 reaches a threshold point t1, the thickness of the first metal-containing layer 130 may maintain the first thickness TH1. The threshold point t1 may be, for example, from 10 seconds to 200 seconds after the screening atom precursors C1 are supplied onto the first metal-containing layer 130, but is not limited thereto.

When the injection time of the screening atoms B1 exceeds the threshold point t1, the thickness of the first metal-containing layer 130 may increase in the range of several Å. For example, as shown in the graph of FIG. 12, when the injection time of the screening atoms B1 exceeds 30 seconds from the threshold point t1, the thickness of the first metal-containing layer 130 may increase by about 4 Å. Then, when the injection time of the screening atoms B1 further increases, the thickness of the first metal-containing layer 130 may further increase. However, as described above, when the thickness of the first metal-containing layer 130 increases more than 5 Å, a separate layer including the screening atoms B1 may be formed on the upper surface of the first metal-containing layer 130, and, thus, the curing atoms D2 (refer to FIG. 6) may be blocked from being injected into the first metal-containing layer 130.

FIG. 13 is a graph for comparing the amount of curing atoms injected into the first metal-containing layer 130 after forming the curing atom screening region 130B according to an example embodiment of the present inventive concepts to the amount of curing atoms injected into a comparative experimental example.

Figure 13A:
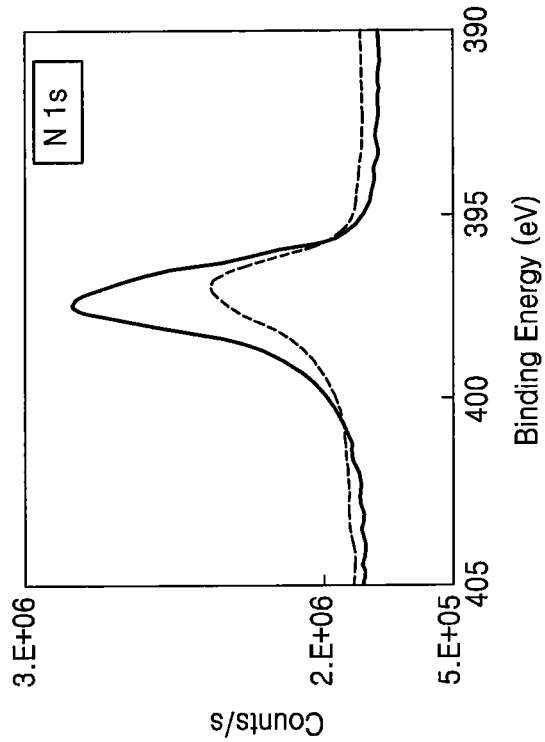
FIGS. 13A and 13B are graphs comparing the amount of curing atoms injected into a first metal-containing layer after forming a curing atom screening region according to an example embodiment of the present inventive concepts to the amount of curing atoms injected into a comparative experimental example.
Figure 13B:
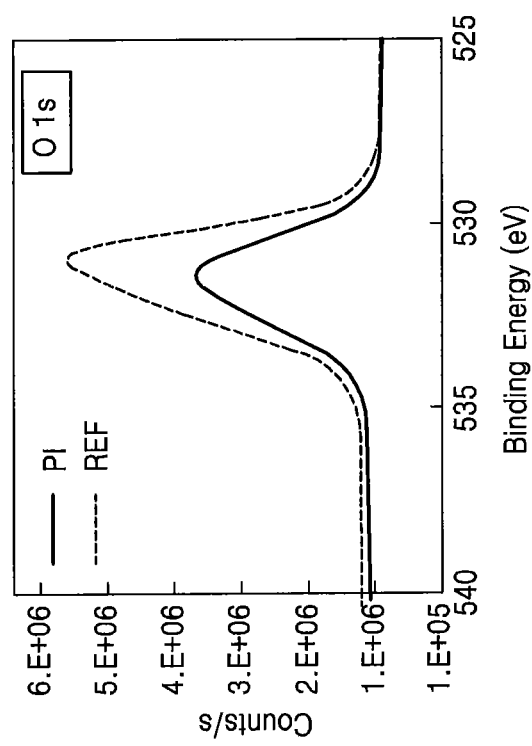

The graphs of FIGS. 13A and 13B show a result obtained by analyzing an experimental example PI according to an example embodiment of the present inventive concepts and a comparative experimental example REF by using X-ray photoelectronic spectroscopy (XPS).

Referring to FIGS. 13A and 13B together with FIGS. 5 and 6, in the experimental example PI, a TiN layer is formed as the first metal-containing layer 130, the curing atom screening region 130B is formed in an upper portion of the first metal-containing layer 130 by injecting Si atoms into the first metal-containing layer 130 as the screening atoms B1, and then the first metal-containing layer 130 is exposed to an air atmosphere. In the comparative experimental example REF, the first metal-containing layer 130 is exposed to an air atmosphere without forming the curing atom screening region 130B in the TiN layer, i.e., the first metal-containing layer 130. In the comparative experimental example REF, after the first metal-containing layer 130 is exposed to an air atmosphere, a capping layer formed of polysilicon is formed on the TiN layer, i.e., the first metal-containing layer 130, to prevent oxygen atoms, which are curing atoms, from being additionally injected into the TiN layer.

Referring to FIG. 13A, in the experimental example PI, although the first metal-containing layer 130 is exposed to an air atmosphere, oxygen "O 1s" is less detected than the comparative experimental example REF. On the other hand, referring to FIG. 13B, in the comparative experimental example REF, nitrogen "N 1s" forming the TiN layer is sharply reduced compared to the experimental example PI. Thus, for the comparative experimental example REF, nitrogen "N 1s" forming the TiN layer is reduced and a lot of oxygen "O 1s" is detected.

In other words, in the comparative experimental example REF, the TiN layer used as the first metal-containing layer 130 is mostly oxidized, whereas in the experimental example PI, the amount of oxygen atoms (i.e., the curing atoms D2), which is injected into the TiN layer used as the first metal-containing layer 130, is limited, and thus, only a portion of the TiN layer is oxidized.

In the case of forming a semiconductor device having a fine structure, the thickness of the first metal-containing layer 130 may be a relatively small value. For example, the first metal-containing layer 130 may be formed to have a thickness of several nanometers to several hundred nanometers. When the first metal-containing layer 130 having a thickness of the small value (e.g., a thickness from 2 nanometers to 200 nanometers) is exposed to an atmosphere for the injection of the curing atoms D2, the first metal-containing layer 130 may be saturated with the curing atoms D2 after the lapse of a very short threshold time. Accordingly, since the first metal-containing layer 130 is saturated with the curing atoms D2 at the same time as the exposure thereof, it may be substantially impossible to control the amount of curing atoms D2, which are injected into the first metal-containing layer 130, by making a time, for which the curing atoms D2 are injected into the first metal-containing layer 130, be shorter than a threshold time.

However, since in the experimental example PI, oxygen (i.e., the curing atoms D2) is less detected than the comparative experimental example REF, it may be understood that the amount of curing atoms D2, which are injected into the first metal-containing layer 130, does not increase even if the threshold time elapses. In other words, it may be understood that the curing atoms D2 are not injected into the first metal-containing layer 130 any more after the threshold time elapses.

Accordingly, it may be understood that in the experimental example PI according to the example embodiment of the present inventive concepts, the amount of curing atoms D2, which are injected into the first metal-containing layer 130, may be controlled by the curing atom screening region 130B.

Figure 14B:
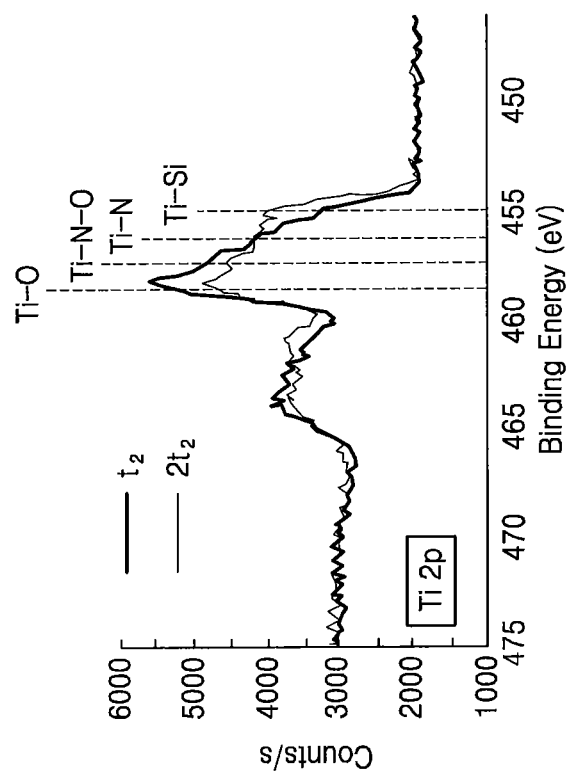
FIGS. 14A and 14B are graphs illustrating the amount of curing atoms injected into a first metal-containing layer, depending on a screening atom injection time, in the process of injecting screening atoms into an upper surface of the first metal-containing layer according to an example embodiment of the present inventive concepts.
Figure 14A:
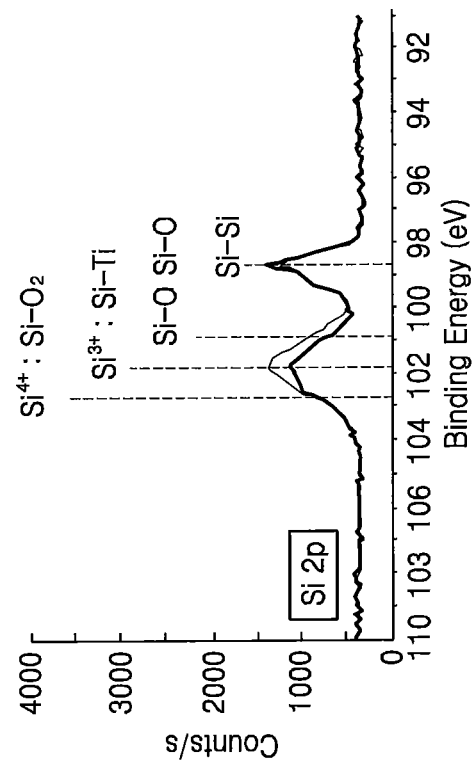

FIGS. 14A and 14B are graphs illustrating the amount of curing atoms injected into the first metal-containing layer, depending on a screening atom injection time, in the process of injecting screening atoms into an upper surface of the first metal-containing layer 130, according to an example embodiment of the present inventive concepts.

Referring to FIGS. 14A and 14B together with FIGS. 2 through 6, the graphs of FIGS.

14A and 14B show a result obtained by analyzing the case in which a time for which the screening atoms B1 are injected into the first metal-containing layer 130 is set to a first time $t_2$ or a second time $2t_2$, which is twice the first time $t_2$, in the state in which a TiN layer is formed as the first metal-containing layer 130, the curing atom screening region 130B is formed in an upper portion of the first metal-containing layer 130 by injecting Si atoms, which are the screening atoms B1, into the first metal-containing layer 130 by using a gas phase-silicon precursors as the screening atom precursors Cl, and then the first metal-containing layer 130 is exposed to an air atmosphere.

When the time for which the screening atoms B1 are injected into the first metal-containing layer 130 is the first time $t_2$, peaks Ti—O, Ti—N—O, and Si—O related to oxygen atoms, which are the curing atoms D2, are relatively high. When the time for which the screening atoms B1 are injected into the first metal-containing layer 130 is the second time $2t_2$, peaks Ti—Si and $Si^{3+}$:Si—Ti related to Si atoms, which are the screening atoms B1, are relatively high and the peaks Ti—O, Ti—N—O, and Si—O related to the oxygen atoms are relatively low.

In other words, when the time for which the screening atoms B1 are injected into the first metal-containing layer 130 increases, the amount of screening atoms B1, which are injected into the first metal-containing layer 130, increases, but the amount of curing atoms B2 that are injected into the first metal-containing layer 130 decreases.

Accordingly, the amount of curing atoms B2 that are injected into the first metal-containing layer 130 is inversely proportional to the amount of screening atoms B1, which are injected into the first metal-containing layer 130.

Figure 15:
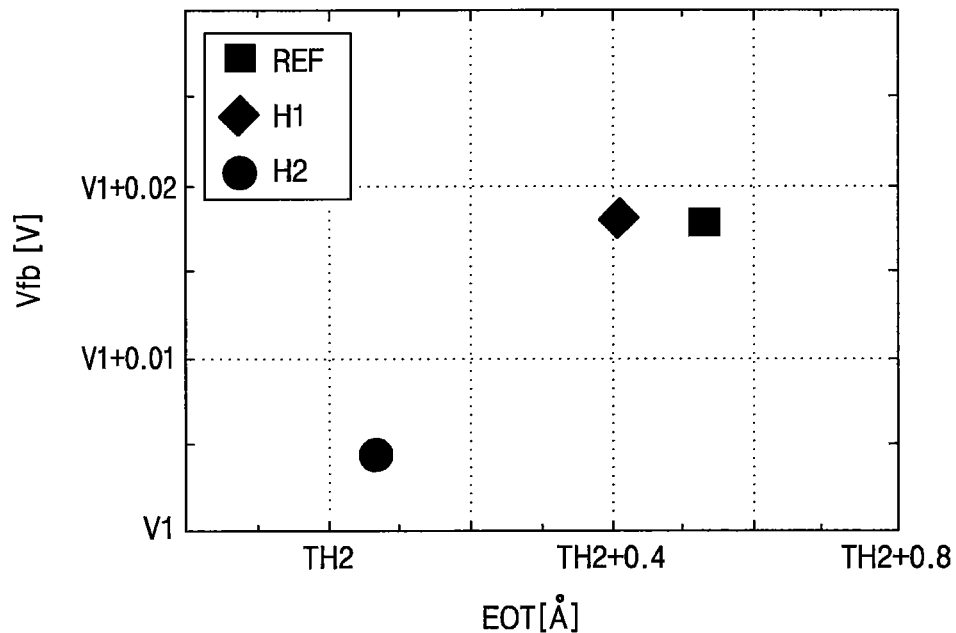
FIGS. 15 through 17 are graphs comparing the electrical characteristics of a dielectric layer obtained according to an example embodiment of the present inventive concepts to those of a comparative experimental example.
Figure 16:
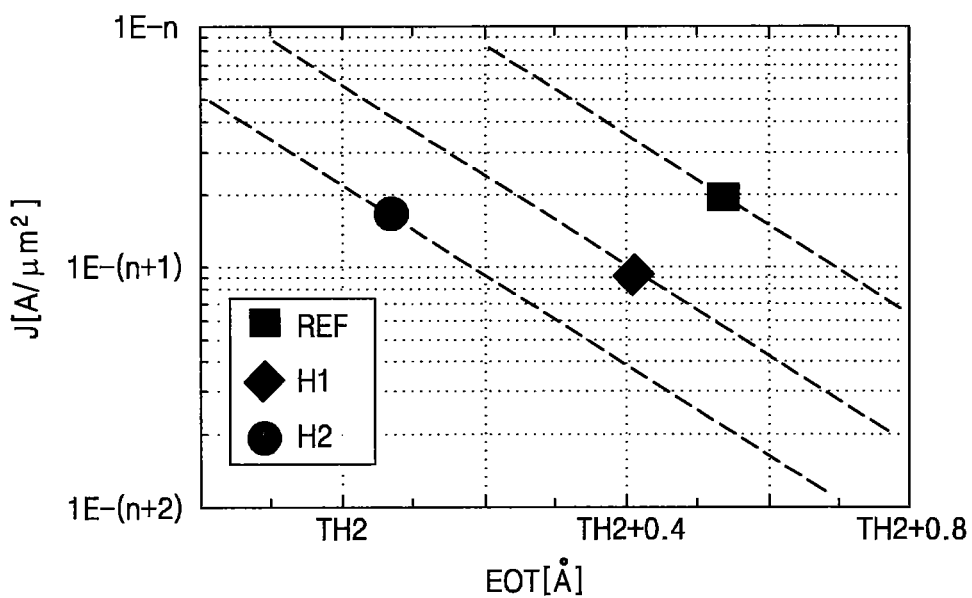
Figure 17:
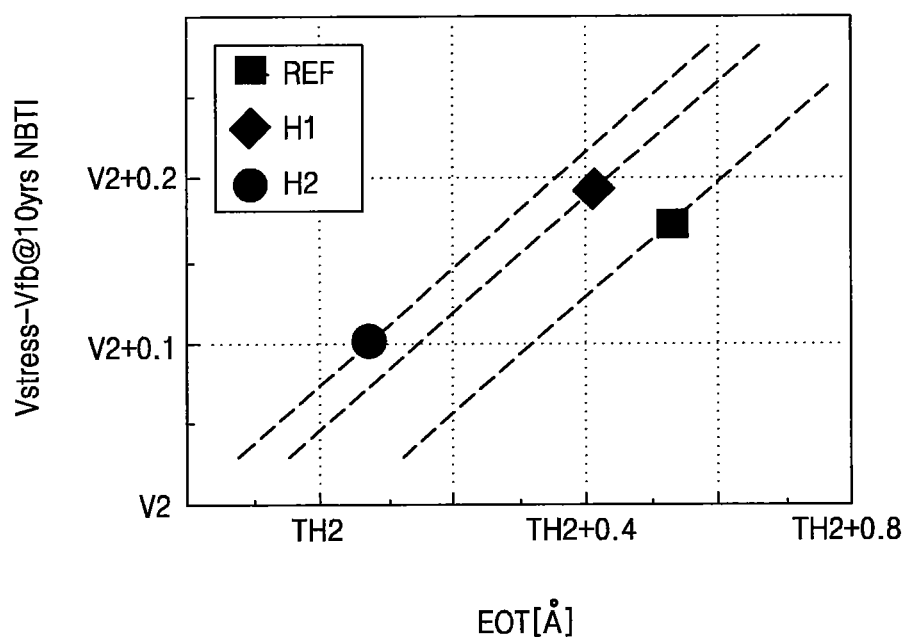

FIGS. 15 through 17 are graphs for comparing electrical characteristics of a dielectric layer, obtained by performing the curing of the dielectric layer according to an example embodiment of the present inventive concepts to those of a comparative experimental example.

In FIGS. 15 through 17, a first heat treatment experimental example H1 according to an example embodiment of the present inventive concepts is an experimental example of performing the process IF of injecting the curing atoms D2 into a dielectric layer, described with reference to FIG. 7, and a second heat treatment experimental example H2 according to an example embodiment of the present inventive concepts is an experimental example of performing the process SC of scavenging defect-inducing atoms, described with reference to FIG. 8.

In FIGS. 15 through 17, TH2 denotes a reference thickness and V1 and V2 each denote a reference voltage. TH2, V1, and V2 are used to indicate a relative comparison between the first and second heat treatment experimental examples H1 and H2 and a comparative experimental example REF.

FIG. 15 shows a relationship between an effective oxide thickness (EOT) and a flat-band voltage (Vfb) in the first and second heat treatment experimental examples H1 and H2 and the comparative experimental example REF.

Referring to FIG. 15, the Vfb of the first heat treatment experimental example H1 is similar to that of the comparative experimental example REF, but the EOT of the first heat treatment experimental example H1 is smaller than that of the comparative experimental example REF. In addition, the Vfb of the second heat treatment experimental example H2 is smaller than that of the comparative experimental example REF, and the EOT of the second heat treatment experimental example H2 is also smaller than that of the comparative experimental example REF.

Accordingly, a method of curing a dielectric layer according to an example embodiment of the present inventive concepts may reduce the EOT of the dielectric layer.

FIG. 16 shows the leakage current densities of the first and second heat treatment experimental examples H1 and H2 and the leakage current density of the comparative experimental example REF.

In the case of dielectric layers having the same film quality, the leakage current density (J) tends to increase when the EOT decreases, and tends to decrease when the EOT increases. Accordingly, when it is assumed that a dielectric layer of the first heat treatment experimental example H1, a dielectric layer of the second heat treatment experimental example H2, and a dielectric layer of the comparative experimental example REF have the same EOT, the leakage current density of the second heat treatment H2 is the lowest, and the leakage current density of the first heat treatment H1 is also lower than that of the comparative experimental example REF.

FIG. 17 shows the negative bias temperature instabilities (NBTI) of the first and second heat treatment experimental examples H1 and H2 and the NBTI of the comparative experimental example REF.

In the case of dielectric layers having the same film quality, stress characteristics Vstress-Vfb tend to weaken when the EOT decreases, and tend to strengthen when the EOT increases. Accordingly, when it is assumed that a dielectric layer of the first heat treatment experimental example H1, a dielectric layer of the second heat treatment experimental example H2, and a dielectric layer of the comparative experimental example REF have the same EOT, the stress characteristics Vstress-Vfb of the second heat treatment H2 are the strongest, and the stress characteristics Vstress-Vfb of the first heat treatment H1 are also stronger than those of the comparative experimental example REF.

Referring to FIGS. 15 through 17, the method of curing a dielectric layer according to an example embodiment of the present inventive concepts may improve the reliability of the dielectric layer as well as reduce the EOT of the dielectric layer. In addition, in the second heat treatment experimental example H2, the Vfb is reduced and thus characteristics of a device using the dielectric layer may also be changed.

Accordingly, in consideration of the desirability for the improvement of the reliability of a device and the necessity for the adjustment of characteristics of the device, the process IF of injecting the curing atoms D2 into a dielectric layer, described with reference to FIG. 7, and the process SC of scavenging defect-inducing atoms, described with reference to FIG. 8, may be selectively performed, or both the process IF and the process SC may be performed.

FIGS. 18 through 22 are perspective views illustrating semiconductor devices 1 through 5 formed by using a method of curing a dielectric layer according to an example embodiment of the present inventive concepts.

Figure 18:
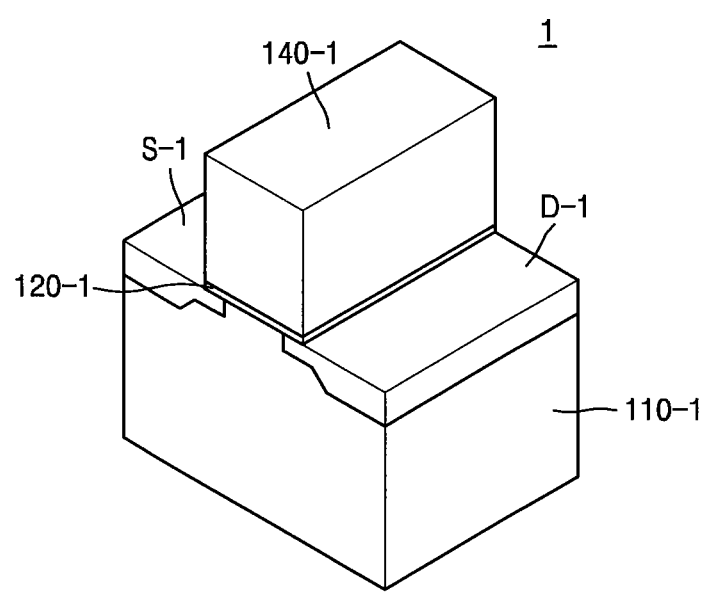
FIGS. 18 through 22 are perspective views illustrating semiconductor devices formed by using a method of curing a dielectric layer according to an example embodiment of the present inventive concepts.

Referring to FIG. 18, the semiconductor device 1 includes a semiconductor layer 110-1, a gate insulating film 120-1, and a gate electrode 140-1. The semiconductor layer 110-1 and the gate insulating film 120-1 may be the semiconductor layer 110 and the dielectric layer 120, respectively, described with reference to FIGS. 1 through 11, and the gate electrode 140-1 may be the second metal-containing layer 130 or the gate electrode 140a.

The semiconductor device 1 may form a planar field effect transistor (FET). A source/drain region S-1/D-1 may be formed in a portion of the semiconductor layer 110-1.

Figure 19:
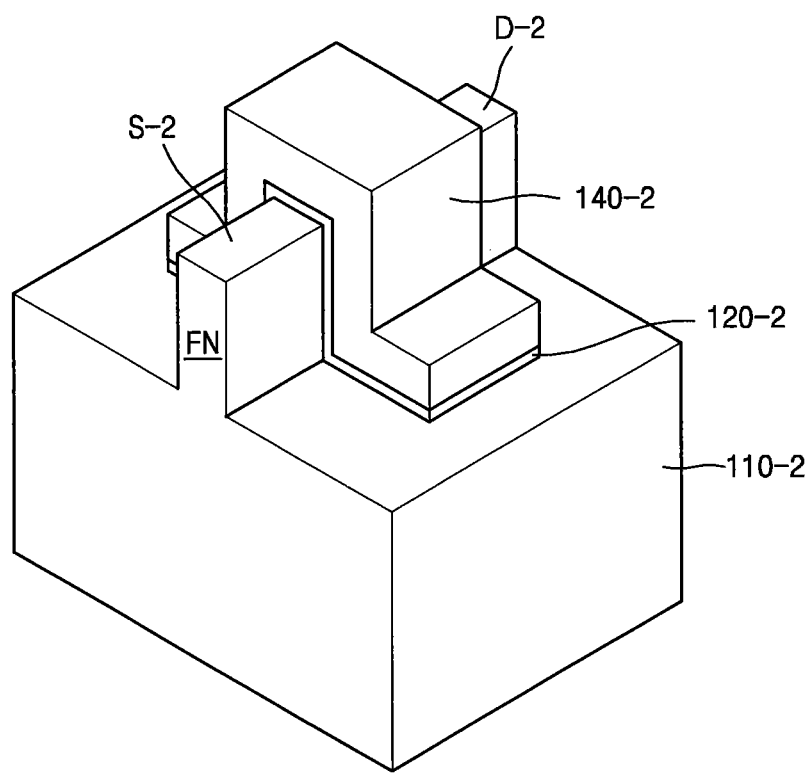

Referring to FIG. 19, the semiconductor device 2 includes a semiconductor layer 110-2, a gate insulating film 120-2, and a gate electrode 140-2. The semiconductor layer 110-2 and the gate insulating film 120-2 may be the semiconductor layer 110 and the dielectric layer 120, respectively, described with reference to FIGS. 1 through 11, and the gate electrode 140-2 may be the second metal-containing layer 130 or the gate electrode 140a.

The semiconductor device 2 may form a fm-type field effect transistor (FinFET) having a fin shape (FN) in which a portion of the semiconductor layer 110-2 protrudes. A source/drain region S-2/D-2 may be formed in a portion of the semiconductor layer 110-2.

Figure 20:
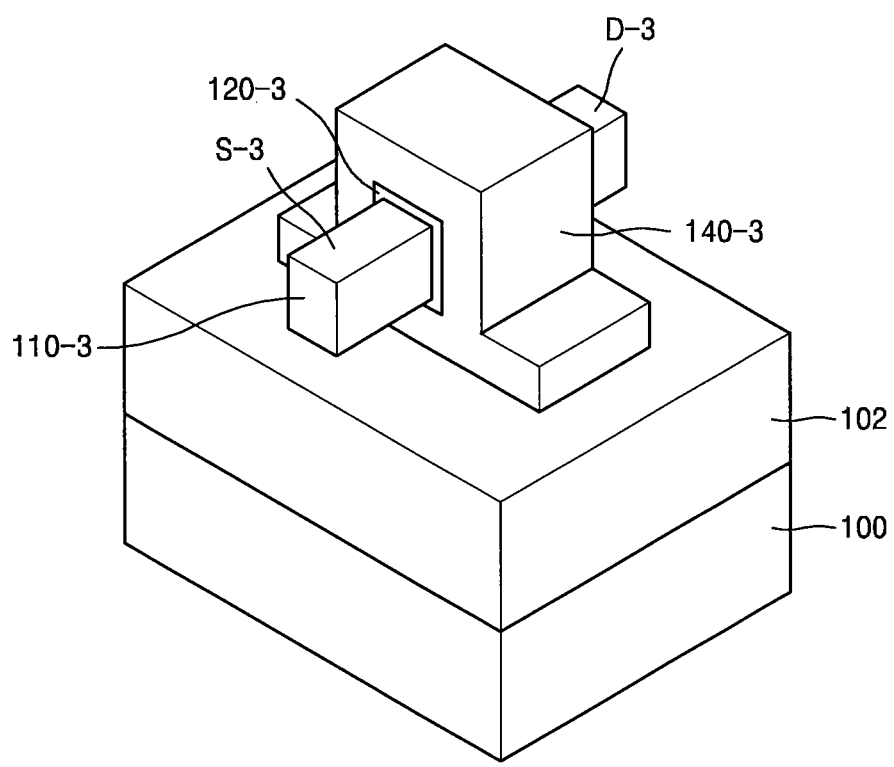

Referring to FIG. 20, the semiconductor device 3 includes a base substrate 100 and a BOX layer 102 formed on the base substrate 100. The semiconductor device 3 further includes a semiconductor layer 110-3, a gate insulating film 120-3, and a gate electrode 140-3, formed on the BOX layer 102. The semiconductor layer 110-3 and the gate insulating film 120-3 may be the semiconductor layer 110 and the dielectric layer 120, respectively, described with reference to FIGS. 1 through 11, and the gate electrode 140-3 may be the second metal-containing layer 130 or the gate electrode 140a.

The base substrate 100 may be a substrate including a semiconductor material. The base substrate 100 may include, for example, silicon (Si). Also, the base substrate 100 may include a semiconductor element, such as, e.g., Ge, or a compound semiconductor material, such as, e.g., SiC, GaAs, InAs, or InP. The BOX layer 102 may include, for example, oxide.

The semiconductor device 3 may form a gate-all-around (GAA) FET in which the gate electrode 140-3 covers the periphery of the semiconductor layer 110-3 with the gate insulating film 120-3 interposed therebetween. A source/drain region S-3/D-3 may be formed in a portion of the semiconductor layer 110-3.

Figure 21:
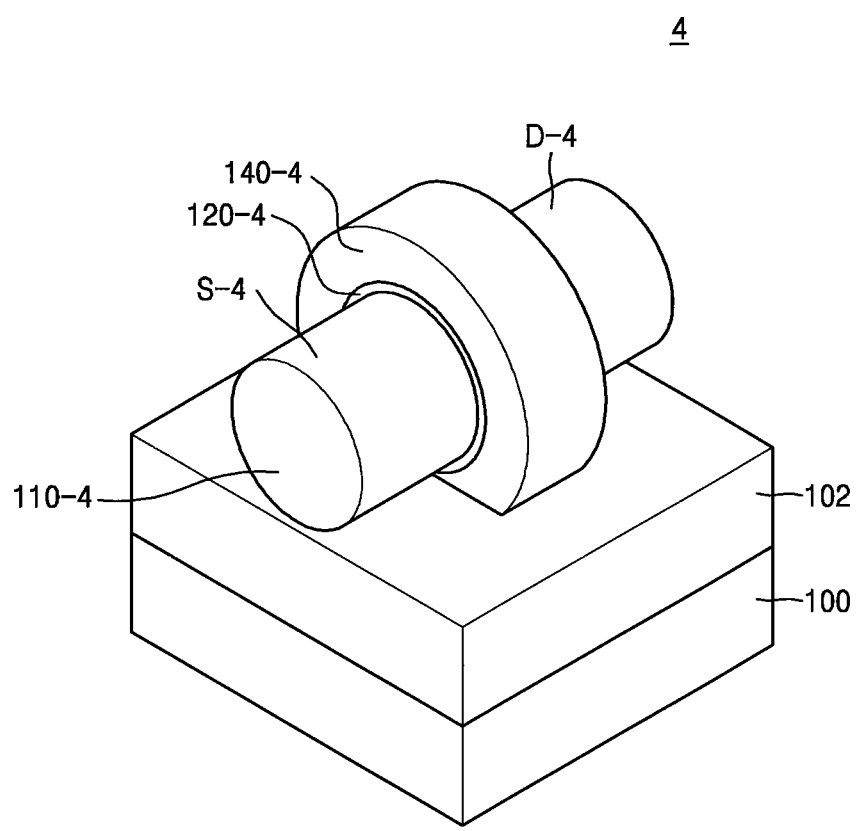

Referring to FIG. 21, the semiconductor device 4 includes a base substrate 100 and a BOX layer 102 formed on the base substrate 100. The semiconductor device 4 further includes a semiconductor layer 110-4, a gate insulating film 120-4, and a gate electrode 140-4, formed on the BOX layer 102. The semiconductor layer 110-4 and the gate insulating film 120-4 may be the semiconductor layer 110 and the dielectric layer 120, respectively, described with reference to FIGS. 1 through 11, and the gate electrode 140-4 may be the second metal-containing layer 130 or the gate electrode 140a.

The semiconductor device 4 may form a nanowire FET formed of a nanowire, in which the semiconductor layer 110-4 extends in a direction that is parallel to a main surface of the base substrate 100. A source/drain region S-4/D-4 may be formed in a portion of the semiconductor layer 110-4.

Figure 22:
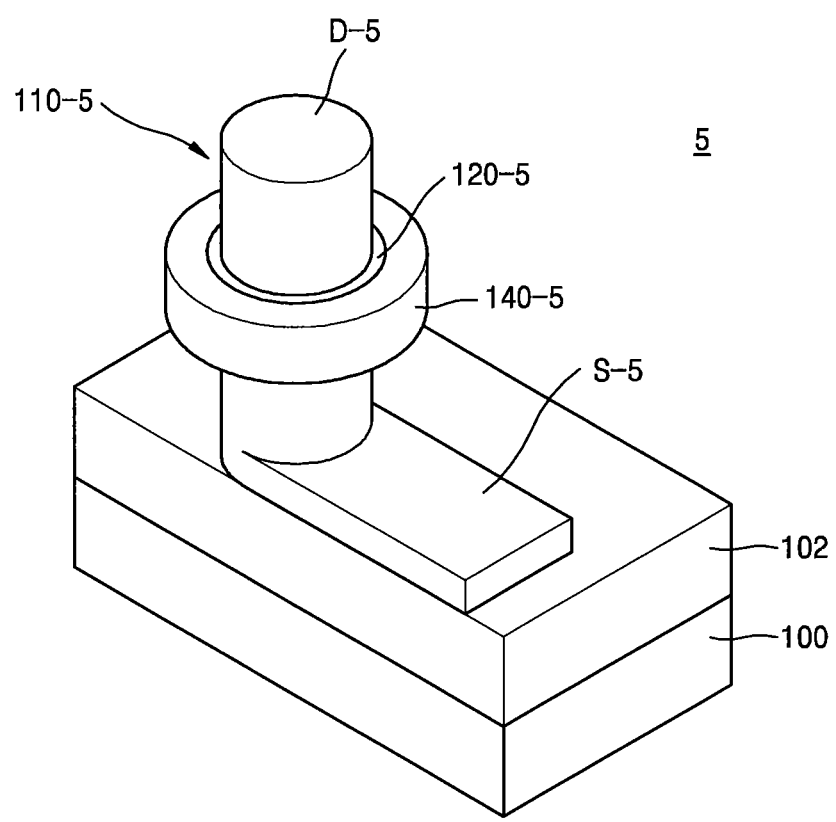

Referring to FIG. 22, the semiconductor device 5 includes a base substrate 100 and a BOX layer 102 formed on the base substrate 100. The semiconductor device 5 further includes a semiconductor layer 110-5, a gate insulating film 120-5, and a gate electrode 140-5, formed on the BOX layer 102. The semiconductor layer 110-5 and the gate insulating film 120-5 may be the semiconductor layer 110 and the dielectric layer 120, respectively, described with reference to FIGS. 1 through 11, and the gate electrode 140-5 may be the second metal-containing layer 130 or the gate electrode 140a.

The semiconductor device 5 may form a vertical columnar FET in which at least a portion of the semiconductor layer 110-5 extends in a direction that is perpendicular to a main surface of the base substrate 100. A source/drain region S-5/D-5 may be formed in a portion of the semiconductor layer 110-5.

As shown in FIGS. 18 through 22, the gate insulating films 120-1, 120-2, 120-3, 120-4, and 120-5 included in semiconductor devices 1, 2, 3, 4, and 5, respectively, may have a relatively small thickness and/or a narrow width and/or may have a complicated shape. However, since a method of curing a dielectric layer according to an example embodiment of the present inventive concepts uses screening atom precursors in a gas phase or a liquid phase, the dielectric layer, which corresponds to the gate insulating films 120-1, 120-2, 120-3, 120-4, and 120-5, may be curable by using the method even if the dielectric layer has a relatively small thickness and/or a narrow width and/or have a complicated shape. Thus, a semiconductor device having improved reliability may be formed.

Figure 23:
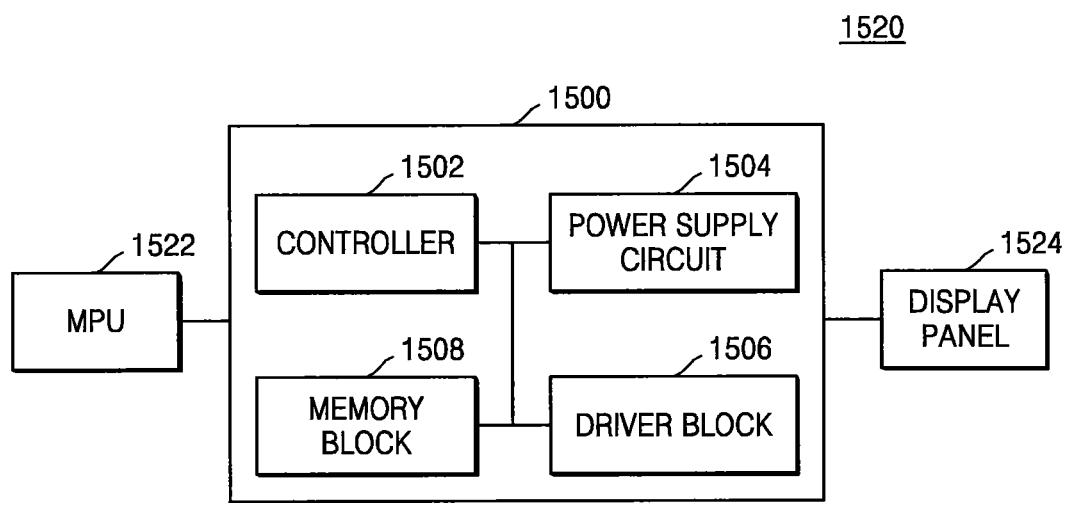
FIG. 23 is a block diagram of a displayer driver IC (DDI) and a display apparatus including the DDI, according to an example embodiment of the present inventive concepts.

FIG. 23 is a block diagram of a displayer driver IC (DDI) 1500 and a display apparatus 1520 including the DDI 1500, according to an example embodiment of the present inventive concepts.

Referring to FIG. 23, the DDI 1500 may include a controller 1502, a power supply circuit 1504, a driver block 1506, and a memory block 1508. The controller 1502 may receive and decode a command applied from a main processing unit (MPU) 1522, and control each block of the DDI 1500 to perform an operation according to the command. The power supply circuit 1504 may generate a driving voltage in response to the control of the controller 1502. The driver block 1506 may drive a display panel 1524 by using the driving voltage generated by the power supply circuit 1504 in response to the control of the controller 1502. The display panel 1524 may be a liquid crystal display panel, a plasma display panel, or an organic light emitting diode (OLED) panel. The memory block 1508 may be a block that temporarily stores the command input to the controller 1502 or control signals output from the controller 1502 or stores necessary data, and may include a memory such as random-access memory (RAM) or read-only memory (ROM). At least one selected from the power supply circuit 1504 and the driver block 1506 may include at least one of the semiconductor devices 1, 2, 3, 4, and 5 each having a cured dielectric layer according to the example embodiments of the present inventive concepts as described with reference to FIGS. 1 through 22 or at least one of semiconductor devices modified or changed from the semiconductor devices 1, 2, 3, 4, and 5.

Figure 24:
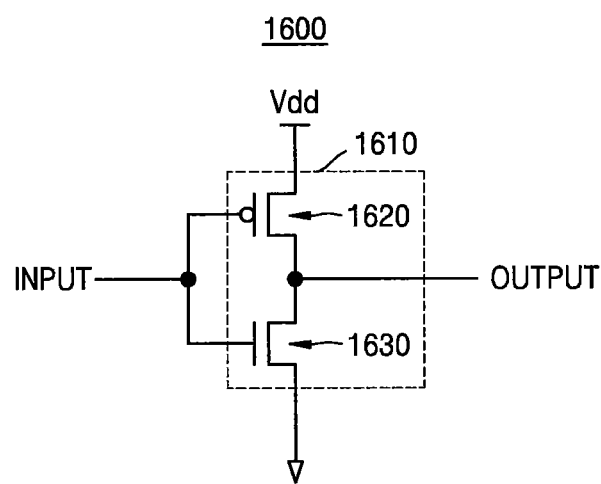
FIG. 24 is a circuit diagram of a complementary metal-oxide semiconductor (CMOS) inverter according to an example embodiment of the present inventive concepts.

FIG. 24 is a circuit diagram of a complementary metal-oxide semiconductor (CMOS) inverter 1600 according to an example embodiment of the present inventive concepts.

The CMOS inverter 1600 may include a CMOS transistor 1610. The CMOS transistor 1610 may include a PMOS transistor 1620 and an NMOS transistor 1630 that are connected between a power terminal Vdd and a ground terminal. The CMOS transistor 1610 may include at least one of the semiconductor devices 1, 2, 3, 4, and 5 each having a cured dielectric layer according to the example embodiments of the present inventive concepts described with reference to FIGS. 1 through 22 or at least one of semiconductor devices modified or changed from the semiconductor devices 1, 2, 3, 4, and 5.

Figure 25:
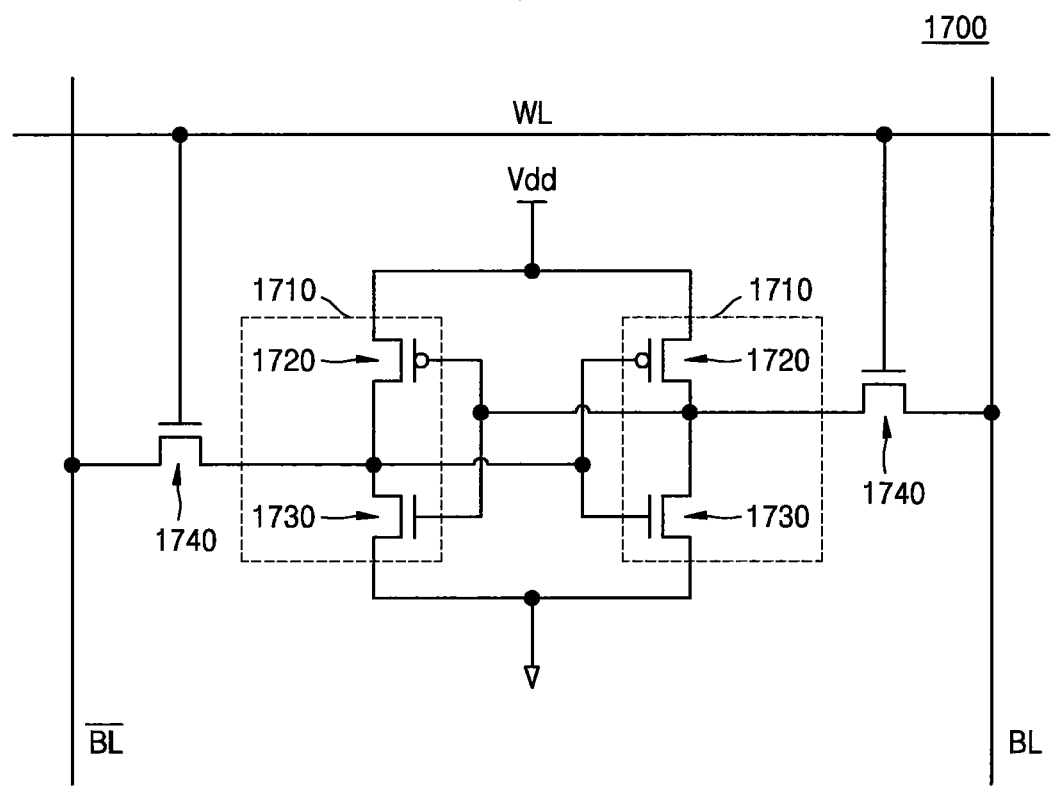
FIG. 25 is a circuit diagram of a CMOS static RAM (SRAM) device according to an example embodiment of the present inventive concepts.

FIG. 25 is a circuit diagram of a CMOS static RAM (SRAM) device 1700 according to an example embodiment of the present inventive concepts.

The CMOS SRAM device 1700 may include a pair of driving transistors 1710. Each of the pair of driving transistors 1710 may include a PMOS transistor 1720 and an NMOS transistor 1730 that are connected between the power terminal Vdd and a ground terminal. The CMOS SRAM device 1700 may further include a pair of transmission transistors 1740. A source of the transmission transistors 1740 may be cross-connected to a common node of the PMOS transistor 1720 and the NMOS transistor 1730 of the driving transistor 1710. The power terminal Vdd may be connected to a source of the PMOS transistor 1720, and the ground terminal may be connected to a source of the NMOS transistor 1730. A word line WL may be connected to gates of the pair of transmission transistors 1740, and a bit line BL and an inverted bit line /BL may be respectively connected to respective drains of the pair of transmission transistors 1740.

At least one selected from the driving transistors 1710 and the transmission transistors 1740 of the CMOS SRAM device 1700 may include at least one of the semiconductor devices 1, 2, 3, 4, and 5 each having a cured dielectric layer according to the example embodiments of the present inventive concepts described with reference to FIGS. 1 through 22 or at least one of semiconductor devices modified or changed from the semiconductor devices 1, 2, 3, 4, and 5.

Figure 26:
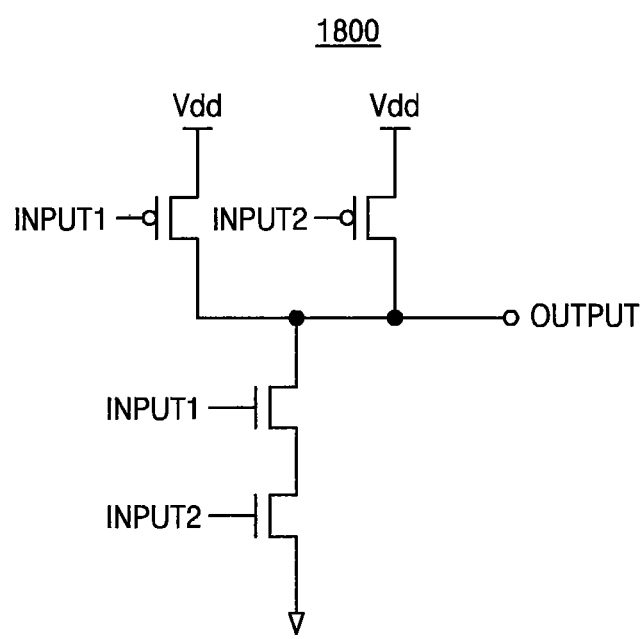
FIG. 26 is a circuit diagram of a CMOS NAND circuit according to an example embodiment of the present inventive concepts.

FIG. 26 is a circuit diagram of a CMOS NAND circuit 1800 according to an example embodiment of the present inventive concepts.

The CMOS NAND circuit 1800 may include a pair of CMOS transistors to which different input signals are transmitted. The CMOS NAND circuit 1800 may include at least one of the semiconductor devices 1, 2, 3, 4, and 5 each having a cured dielectric layer according to the example embodiments of the present inventive concepts described with reference to FIGS. 1 through 22 or at least one of semiconductor devices modified or changed from the semiconductor devices 1, 2, 3, 4, and 5.

Figure 27:
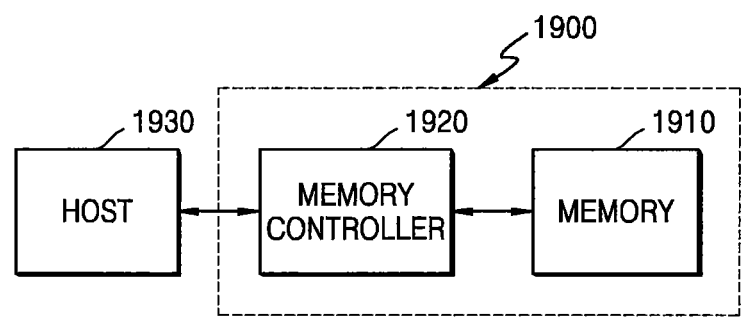
FIG. 27 is a block diagram of an electronic system according to an example embodiment of the present inventive concepts.

FIG. 27 is a block diagram of an electronic system 1900 according to an example embodiment of the present inventive concepts.

The electronic system 1900 may include a memory 1910 and a memory controller 1920. The memory controller 1920 may control the memory 1910 to read and/or write data from or to the memory 1910 in response to a request of a host 1930. At least one selected from the memory 1910 and the memory controller 1920 may include at least one of the semiconductor devices 1, 2, 3, 4, and 5 each having a cured dielectric layer according to the example embodiments of the present inventive concepts described with reference to FIGS. 1 through 22 or at least one of semiconductor devices modified or changed from the semiconductor devices 1, 2, 3, 4, and 5.

Figure 28:
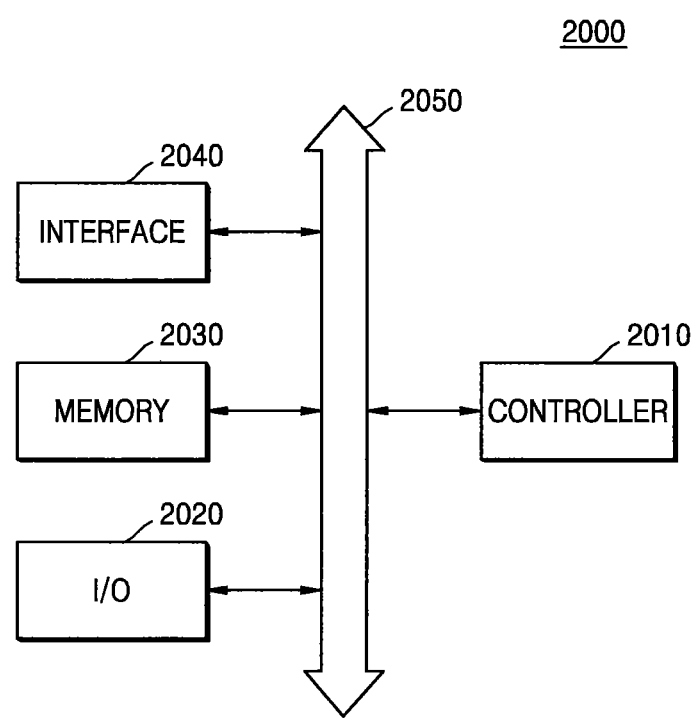
FIG. 28 is a block diagram of an electronic system according to an example embodiment of the present inventive concepts.

FIG. 28 is a block diagram of an electronic system 2000 according to an example embodiment of the present inventive concepts.

The electronic system 2000 may include a controller 2010, an input/output (I/O) device 2020, a memory 2030, and an interface 2040, which are connected to one another via a bus 2050.

The controller 2010 may include at least one selected from a microprocessor, a digital signal processor, and a processor similar to the microprocessor and the digital signal processor. The I/O device 2020 may include at least one of a keypad, a keyboard, and a display. The memory 2030 may be used in storing a command executed by the controller 2010. For example, the memory 2030 may be used to store user data.

The electronic system 2000 may be configured as a wireless communication apparatus or an apparatus capable of transmitting and/or receiving information under a wireless communication environment. In order for the electronic system 2000 to transmit or receive data over a wireless communication network, the interface 2040 may be a wireless interface. The interface 2040 may include an antenna and/or a wireless transceiver. In some embodiments, the electronic system 2000 may be used in a communication interface protocol of a $3^{rd}$ generation communication system such as a code division multiple access (CDMA), global system for mobile communications (GSM), North American digital cellular (NADC), extended-time division multiple access E-TDMA, and/or wide band code division multiple access (WCDMA). The electronic system 2000 may include at least one of the semiconductor devices 1, 2, 3, 4, and 5 each having a cured dielectric layer according to the example embodiments of the present inventive concepts described with reference to FIGS. 1 through 22 or at least one of semiconductor devices modified or changed from the semiconductor devices 1, 2, 3, 4, and 5.

The foregoing is illustrative of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present inventive concepts as well as the appended claims.

What is claimed is:

1. A method of curing a dielectric layer for the manufacture of a semiconductor device, the method comprising:
   providing the dielectric layer, wherein the dielectric layer is on a semiconductor layer;

forming a first metal-containing layer on the dielectric layer;

forming a curing atom screening region in an upper portion of the first metal-containing layer by injecting screening atoms onto an upper surface of the first metal-containing layer;

injecting curing atoms into the first metal-containing layer through the upper surface of the first metal-containing layer; and flowing the curing atoms into the dielectric layer in an atmosphere at a first temperature.

2. The method of claim 1, further comprising moving defect-inducing atoms existing in the dielectric layer and/or on a surface of the dielectric layer to the first metal-containing layer in an atmosphere at a second temperature, wherein the second temperature is greater than the first temperature.

3. The method of claim 1, further comprising, after flowing the curing atoms into the dielectric layer, removing the first metal-containing layer; and forming a second metal-containing layer on the dielectric layer.

4. The method of claim 3, wherein the dielectric layer comprises a gate dielectric film, and the second metal-containing layer is a gate electrode.

5. The method of claim 4, wherein the gate dielectric film and the gate electrode form at least one selected from a planar field effect transistor (FET), a fin-type FET (FinFET), a gate-all-around (GAA) FET, a vertical columnar FET, and a nanowire FET.

6. The method of claim 1, further comprising, after flowing the curing atoms into the dielectric layer, forming a second metal-containing layer on the first metal-containing layer.

7. The method of claim 1, wherein the dielectric layer comprises a first dielectric layer having a first relative dielectric constant and a second dielectric layer on the first dielectric layer, the second dielectric layer having a second relative dielectric constant that is higher than the first relative dielectric constant, and wherein flowing the curing atoms into the dielectric layer comprises flowing the curing atoms into the second dielectric layer.

8. The method of claim 7, wherein the second dielectric layer comprises one selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a combination thereof.

9. The method of claim 1, wherein the first metal-containing layer is formed in an atmosphere at a third temperature, wherein forming the curing atom screening region comprises supplying screening atom precursors onto the first metal-containing layer in-situ after forming the first metal-containing layer, and wherein the screening atom precursors are thermally decomposed at a temperature that is lower than the third temperature.

10. The method of claim 9, wherein the screening atom precursors are in a gas phase or a liquid phase.

11. The method of claim 9, wherein the screening atom precursors are silicon chloride, boron chloride, nitrogen fluoride, sulfur fluoride, carbon fluoride, hydrogen bromide, sulfide of cobalt, fluorocarbon, hydrofluorocarbon, methane, ammonia, or titanium tetrachloride.

12. The method of claim 1, wherein an amount of curing atoms that are injected into the first metal-containing layer is controlled by an amount of screening atoms that are injected into the first metal-containing layer.

13. The method of claim 1, wherein injecting curing atoms into the first metal-containing layer is performed in an air atmosphere, an oxygen atmosphere, a water vapor atmosphere, a nitrogen atmosphere, or an oxygen and nitrogen atmosphere.

14. The method of claim 1, wherein the first metal-containing layer comprises one selected from TiN, TaN, W, TiAlC, TaAlC, TaAl, TiAl, HfAl, Al, Ti, WN, Ru, Mo, and a combination thereof.

15. The method of claim 1, wherein the screening atoms are Si, B, N, S, C, Br, Co, or Ti atoms.

16. The method of claim 1, wherein the curing atoms are oxygen or nitrogen atoms.

17. The method of claim 16, wherein the curing atoms are oxygen atoms, and responsive to injecting the curing atoms into the first metal-containing layer, at least a portion of the first metal-containing layer is not oxidized.

18. The method of claim 1, wherein, responsive to forming the curing atom screening region, a thickness of the first metal-containing layer increases by 5 Å or less.

19. The method of claim 1, wherein, responsive to injecting the curing atoms into the first metal-containing layer, the curing atoms are not injected into the first metal-containing layer after elapsing of a threshold time.

20. A method of curing a dielectric layer for the manufacture of a semiconductor device, the method comprising:

contacting screening atom precursors to a first metal-containing layer, wherein the first metal-containing layer is on a dielectric layer;

forming a curing atom screening region in an upper portion of the first metal-containing layer in an atmosphere at a first temperature;

injecting curing atoms into the first metal-containing layer; and flowing the curing atoms into the dielectric layer.

* * * * *